US010923640B2

(12) United States Patent
Schwarz et al.

(10) Patent No.: US 10,923,640 B2
(45) Date of Patent: Feb. 16, 2021

(54) OPTOELECTRONIC COMPONENT AND METHOD OF PRODUCING SAME

(71) Applicant: OSRAM Opto Semiconductors GmbH, Regensburg (DE)

(72) Inventors: Thomas Schwarz, Regensburg (DE); Stefan Listl, Pettendorf (DE); Björn Hoxhold, Sinzing Viehhausen (DE); Frank Singer, Regenstauf (DE)

(73) Assignee: OSRAM OLED GmbH, Regensburg (DE)

( * ) Notice: Subject to any disclaimer, the term of this patent is extended or adjusted under 35 U.S.C. 154(b) by 0 days.

(21) Appl. No.: 15/771,827

(22) PCT Filed: Oct. 28, 2016

(86) PCT No.: PCT/EP2016/076062
§ 371 (c)(1),
(2) Date: Apr. 27, 2018

(87) PCT Pub. No.: WO2017/072294
PCT Pub. Date: May 4, 2017

(65) Prior Publication Data
US 2018/0358522 A1 Dec. 13, 2018

(30) Foreign Application Priority Data
Oct. 28, 2015 (DE) .......................... 10 2015 118 433

(51) Int. Cl.
*H01L 33/62* (2010.01)
*H01L 25/075* (2006.01)
(Continued)

(52) U.S. Cl.
CPC .............. *H01L 33/62* (2013.01); *H01L 24/48* (2013.01); *H01L 25/0753* (2013.01);
(Continued)

(58) Field of Classification Search
CPC ......... H01L 33/52; H01L 33/54; H01L 33/58; H01L 33/62; H01L 33/483; H01L 33/486;
(Continued)

(56) References Cited

U.S. PATENT DOCUMENTS

2006/0245188 A1* 11/2006 Takenaka ............ H01L 25/0753
362/231
2009/0166657 A1 7/2009 Yamada et al.
(Continued)

FOREIGN PATENT DOCUMENTS

CN 103443941 A 12/2013
CN 203826384 U 9/2014
(Continued)

OTHER PUBLICATIONS

The First Office Action dated Jul. 3, 2020, of counterpart Chinese Application No. 201680063156.1, along with an English translation.

*Primary Examiner* — Sue A Purvis
*Assistant Examiner* — Scott Stowe
(74) *Attorney, Agent, or Firm* — DLA Piper LLP (US)

(57) ABSTRACT

An optoelectronic component includes a carrier, and a housing material arranged above a top side of a carrier, wherein a cavity is configured in the housing material, a top side of a first optoelectronic semiconductor chip is arranged in the cavity, the first optoelectronic semiconductor chip has a first electrical connection pad arranged at the top side of the first optoelectronic semiconductor chip, and electrically conductively connects by a bond wire to a first contact pad arranged at the top side of the carrier, a first section of the bond wire is arranged in the cavity and a second section of the bond wire is embedded the housing material, a covering material is arranged in the cavity and covers at least one part of the top side of the first optoelectronic semiconductor chip, (Continued)

and the first section of the bond wire is embedded in the covering material.

17 Claims, 20 Drawing Sheets

(51) Int. Cl.
*H01L 23/00* (2006.01)
*H01L 33/44* (2010.01)
*H01L 33/48* (2010.01)
*H01L 33/50* (2010.01)
*H01L 33/56* (2010.01)
*H01L 33/54* (2010.01)
*G09F 9/302* (2006.01)
*G09F 9/33* (2006.01)

(52) U.S. Cl.
CPC ............ *H01L 33/44* (2013.01); *H01L 33/483* (2013.01); *H01L 33/502* (2013.01); *H01L 33/56* (2013.01); *G09F 9/3026* (2013.01); *G09F 9/33* (2013.01); *H01L 33/54* (2013.01); *H01L 2224/4809* (2013.01); *H01L 2224/48091* (2013.01); *H01L 2224/48139* (2013.01); *H01L 2224/48227* (2013.01); *H01L 2224/49113* (2013.01); *H01L 2224/73265* (2013.01); *H01L 2924/12041* (2013.01); *H01L 2933/005* (2013.01); *H01L 2933/0025* (2013.01); *H01L 2933/0066* (2013.01); *H01L 2933/0091* (2013.01)

(58) Field of Classification Search
CPC ..... H01L 33/50; H01L 33/505; H01L 33/507; H01L 33/508; H01L 25/0753; H01L 33/56; H01L 33/44; H01L 33/502; H01L 24/48
See application file for complete search history.

(56) References Cited

U.S. PATENT DOCUMENTS

| | | | |
|---|---|---|---|
| 2010/0193822 A1* | 8/2010 | Inobe | H01L 33/60 257/98 |
| 2012/0211774 A1* | 8/2012 | Harada | H01L 33/56 257/88 |
| 2014/0021503 A1 | 1/2014 | Yoshida et al. | |
| 2015/0192281 A1 | 7/2015 | Homma et al. | |
| 2016/0035952 A1* | 2/2016 | Yamada | H01L 24/48 257/98 |

FOREIGN PATENT DOCUMENTS

| | | |
|---|---|---|
| DE | 102 29 067 A1 | 1/2004 |
| DE | 10 2011 115 314 A1 | 4/2013 |
| DE | 10 2012 111 065 A1 | 5/2014 |
| DE | 10 2013 100 711 A1 | 7/2014 |
| DE | 10 2013 218 268 A1 | 3/2015 |
| DE | 10 2015 112 556 A1 | 2/2017 |
| DE | 10 2015 119 653 A1 | 5/2017 |
| WO | 2015/091005 A1 | 6/2015 |

* cited by examiner

OPTOELECTRONIC COMPONENT AND METHOD OF PRODUCING SAME

TECHNICAL FIELD

This disclosure relates to an optoelectronic component and a method of producing an optoelectronic component.

BACKGROUND

Optoelectronic components comprising optoelectronic semiconductor chips arranged in cavities and electrically contacted with bond wires are known. The space requirement necessitated by the bond wires imposes limits on a reduction of the sizes of the cavities in such optoelectronic components.

Video wall modules for constructing video walls are also known. Video walls are display panels for static or moving pictures in which each pixel is formed by one or more light emitting diode chips (LED chips). To achieve a high display quality, small distances of the pixels from one another, a high contrast and a uniform emission in different spatial directions are desirable.

SUMMARY

We provide an optoelectronic component including a carrier, and a first optoelectronic semiconductor chip arranged at a top side of the carrier, and a housing material arranged above the top side of the carrier, wherein a cavity is configured in the housing material, a top side of the first optoelectronic semiconductor chip is arranged in the cavity, the first optoelectronic semiconductor chip has a first electrical connection pad arranged at the top side of the first optoelectronic semiconductor chip, and electrically conductively connects by a bond wire to a first contact pad arranged at the top side of the carrier, a first section of the bond wire is arranged in the cavity and a second section of the bond wire is embedded the housing material, a covering material is arranged in the cavity and covers at least one part of the top side of the first optoelectronic semiconductor chip, and the first section of the bond wire is embedded in the covering material.

We also provide a method of producing an optoelectronic component including arranging a first optoelectronic semiconductor chip at a top side of a carrier; producing an electrically conductive connection between a first electrical connection pad of the first optoelectronic semiconductor chip, the first electrical connection pad being arranged at a top side of the first optoelectronic semiconductor chip, and a first contact pad arranged at the top side of the carrier, by a bond wire; arranging a covering material at the top side of the first optoelectronic semiconductor chip, wherein a first section of the bond wire is embedded in the covering material; and subsequently arranging a housing material above the top side of the carrier, wherein the covering material is at least partly enclosed by the housing material, and a second section of the bond wire is embedded in the housing material.

LIST OF REFERENCE SIGNS

Figure 1:
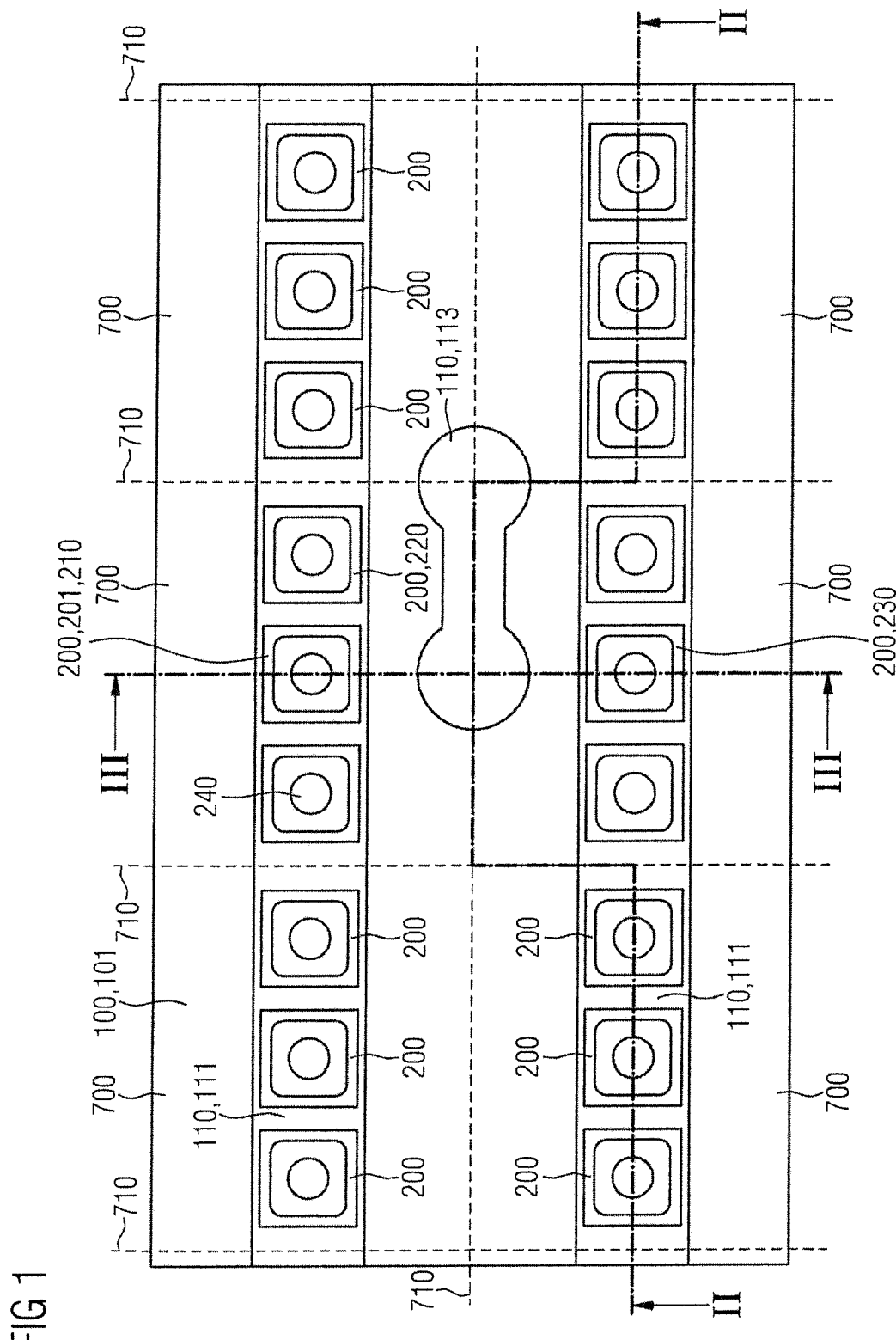
FIG. 1 schematically shows a plan view of a part of a carrier with optoelectronic semiconductor chips arranged thereon.

10 Optoelectronic component
100 Carrier
101 Top side
102 Underside
110 Upper carrier metallization
111 Row line (second contact pad)
112 Row connection structure
113 Column connection structure (first contact pad)
120 Lower carrier metallization
121 Contact pad
130 Through contact
200 Optoelectronic semiconductor chip
201 Top side 202 Underside
210 First optoelectronic semiconductor chip
220 Second optoelectronic semiconductor chip
230 Third optoelectronic semiconductor chip
240 First electrical connection pad
250 Second electrical connection pad
260 Bond wire
261 First section
262 Second section
300 Covering material
400 Housing material
410 Cavity
411 Wall
500 Optically absorbing material
510 Further material
600 Housing
601 Top side
700 Pixel
710 Pixel raster
720 Cross-matrix interconnection

DETAILED DESCRIPTION

Our optoelectronic component comprises a carrier and a first optoelectronic semiconductor chip arranged at a top side of the carrier. A housing material is arranged above the top side of the carrier. A cavity is configured in the housing material. A top side of the first optoelectronic semiconductor chip is arranged in the cavity. A first electrical connection pad of the first optoelectronic semiconductor chip, the first electrical connection pad being arranged at the top side of the first optoelectronic semiconductor chip, is electrically conductively connected by a bond wire to a first contact pad arranged at the top side of the carrier. A first section of the bond wire is arranged in the cavity. A second section of the bond wire is embedded into the housing material.

Embedding the second section of the bond wire into the housing material affords the advantageous possibility of fashioning the cavity configured in the housing material with small dimensions. This advantageously makes it possible to configure the entire optoelectronic component with compact external dimensions, as a result of which the optoelectronic component may be produced cost-effectively. By virtue of the fact that only the first section of the bond wire is arranged in the cavity, in the case of this optoelectronic component advantageously only low losses arise as a result of absorption of electromagnetic radiation emitted by the optoelectronic semiconductor chip at the bond wire. A further advantage of the embedding of the second section of the bond wire into the housing material of this optoelectronic component is that the bond wire is protected against damage as a result of external influences by virtue of the second section of the bond wire being embedded into the housing material. As a result, this optoelectronic component is advantageously particularly robust.

The cavity may be delimited by a wall inclined by an angle of −60° to +60° relative to a direction oriented perpendicularly to the top side of the first optoelectronic semiconductor chip. Advantageously, the wall of the cavity may thereby bring about a focusing of electromagnetic radiation emitted by the optoelectronic semiconductor chip of the optoelectronic component.

A covering material may be arranged in the cavity. In this case, the covering material covers at least one part of the top side of the first optoelectronic semiconductor chip. The first section of the bond wire is embedded into the covering material. The covering material comprises a transmittance of at least 10% for electromagnetic radiation comprising a wavelength from at least one part of the ultraviolet to infrared spectral range. Advantageously, the optoelectronic semiconductor chip and the first section of the bond wire in the optoelectronic component are protected against damage as a result of external influences by virtue of the covering by the covering material. Owing to the small size of the cavity of this optoelectronic component, only a small amount of the covering material is required in this case, as a result of which the optoelectronic component may be produced cost-effectively.

The covering material may comprise embedded particles, for example, embedded scattering particles and/or embedded wavelength-converting particles. An electromagnetic radiation emitted by the optoelectronic component may be homogenized by scattering particles embedded into the covering material. Moreover, scattering particles embedded into the covering material may have the effect that the first section of the bond wire embedded into the covering material is not discernible from outside the optoelectronic component. Wavelength-converting particles embedded into the covering material may convert at least part of an electromagnetic radiation emitted by the first optoelectronic semiconductor chip of the optoelectronic component into electromagnetic radiation comprising a different wavelength. The potting material arranged in the cavity may also comprise absorbing particles.

The covering material and the housing material may terminate flush at a top side facing away from the carrier. Advantageously, the optoelectronic component thereby enables a homogeneous emission of electromagnetic radiation in different spatial directions.

An optically absorbing material may be arranged above the top side of the carrier. In this case, the first optoelectronic semiconductor chip is at least partly embedded into the absorbing material. Advantageously, a particularly high optical contrast between the states with the first optoelectronic semiconductor chip switched on and switched off is produced in the optoelectronic component. This is achieved by the fact that ambient light impinging on the optoelectronic component from outside is absorbed by the optically absorbing material, instead of being reflected.

A second electrical connection pad of the first optoelectronic semiconductor chip, the second electrical connection pad being arranged at an underside of the first optoelectronic semiconductor chip, may be electrically conductively connected to a second contact pad arranged at the top side of the carrier. Advantageously, this enables an electrical driving of the optoelectronic semiconductor chip of the optoelectronic component via the contact pads arranged at the top side of the carrier. In this case, the optoelectronic semiconductor chip may comprise a respective electrical connection pad at its top side and at its underside.

A second electrical connection pad of the first optoelectronic semiconductor chip, the second electrical connection pad being arranged at the top side of the first optoelectronic semiconductor chip, may be electrically conductively connected by a second bond wire to a second contact pad arranged at the top side of the carrier. Advantageously, the electrical contact pads arranged at the top side of the carrier thereby enable an electrical driving of the optoelectronic semiconductor chip of the optoelectronic component. In this case, both electrical connection pads of the optoelectronic semiconductor chip may be arranged at the top side of the optoelectronic semiconductor chip.

A second optoelectronic semiconductor chip may be arranged at the top side of the carrier. In this case, the first electrical connection pad of the first optoelectronic semiconductor chip and an electrical connection pad of the second optoelectronic semiconductor chip, the electrical connection pad being arranged at a top side of the second optoelectronic semiconductor chip, are electrically conductively connected by a bond wire. In this case, the bond wire may extend directly from the first electrical connection pad of the first optoelectronic semiconductor chip to the electrical connection pad of the second optoelectronic semiconductor chip. However, the bond wire may also extend between the first electrical connection pad of the first optoelectronic semiconductor chip and the electrical connection pad of the second optoelectronic semiconductor chip to the top side of the carrier. Advantageously, the electrically conductive connection between the electrical connection pads of the first optoelectronic semiconductor chip and the second optoelectronic semiconductor chip enables driving the first optoelectronic semiconductor chip and the second optoelectronic semiconductor chip via the just one first contact pad of the carrier of the optoelectronic component.

A third optoelectronic semiconductor chip may be arranged at the top side of the carrier. In this case, the top side of the first optoelectronic semiconductor chip and a top side of the third optoelectronic semiconductor chip are arranged jointly in the cavity. Advantageously, the cavity may thereby bring about an intermixing of electromagnetic radiation emitted by the first optoelectronic semiconductor chip and electromagnetic radiation emitted by the third optoelectronic semiconductor chip.

A third optoelectronic semiconductor chip may be arranged at the top side of the carrier. In this case, the top side of the first optoelectronic semiconductor chip and a top side of the third optoelectronic semiconductor chip are arranged in cavities of the housing material that are separated from one another. Advantageously, the cavities configured in the housing material may comprise particularly small dimensions as a result.

An electrical connection pad of the third optoelectronic semiconductor chip may be electrically conductively connected to the second contact pad arranged at the top side of the carrier. Advantageously, the first optoelectronic semiconductor chip and the third optoelectronic semiconductor chip may thereby both be electrically driven via the second contact pad.

Our method of producing an optoelectronic component comprises steps of arranging a first optoelectronic semiconductor chip at a top side of a carrier, producing an electrically conductive connection between a first electrical connection pad of the first optoelectronic semiconductor chip, the first electrical connection pad being arranged at a top side of the first optoelectronic semiconductor chip, and a first contact pad arranged at the top side of the carrier, by a bond wire, arranging a covering material at the top side of the first optoelectronic semiconductor chip, wherein a first section of the bond wire is embedded into the covering material, and arranging a housing material above the top side of the carrier, wherein the covering material is at least partly enclosed by the housing material, wherein a second section of the bond wire is embedded into the housing material. Advantageously, the bond wire in the optoelectronic component obtained by this method is protected against damage as a result of external influences by the second section of the bond wire being embedded into the housing material. The method advantageously makes it possible to bring the housing material very close to the optoelectronic semiconductor chip, as a result of which the optoelectronic component may be produced with compact external dimensions.

An interface may form between the covering material and the housing material, the interface being inclined by an angle of −60° to +60° relative to a direction oriented perpendicularly to the top side of the first optoelectronic semiconductor chip. Advantageously, the interface configured between the covering material and the housing material may then reflect and focus electromagnetic radiation emitted by the first optoelectronic semiconductor chip.

Before arranging the covering material, an optically absorbing material may be arranged above the top side of the carrier. The absorbing material is then at least partly covered by the covering material. Advantageously, the absorbing material arranged above the top side of the carrier in the optoelectronic component obtained by the method may cause the region around the first optoelectronic semiconductor chip to appear darker.

After arranging the housing material, a further step may be carried out to remove the covering material. As a result, a cavity is configured in the housing material at least partly enclosing the covering material. The cavity may subsequently either remain free or be filled with a further material.

The method may comprise a further step of arranging a further covering material in a cavity formed by removing the covering material. Advantageously, the first covering material firstly arranged at the top side of the first optoelectronic semiconductor chip may thereby be chosen such that it is well suited to the production of the optoelectronic component and is suitable, for example, for a photopatterning. The further covering material arranged in the cavity after the first covering material has been removed may be chosen such that it comprises particularly expedient properties during operation of the optoelectronic component obtainable by the method. By way of example, the further covering material may comprise a high optical transparency. The further covering material may also comprise embedded wavelength-converting particles, embedded scattering particles and/or embedded absorbing particles.

A second optoelectronic semiconductor chip may be arranged jointly with the first optoelectronic semiconductor chip at the top side of the carrier. In this case, the first electrical connection pad of the first optoelectronic semiconductor chip and an electrical connection pad arranged at a top side of the second optoelectronic semiconductor chip are electrically conductively connected by a bond wire. Advantageously, in the optoelectronic component obtainable by the method, the first optoelectronic semiconductor chip and the second optoelectronic semiconductor chip may thereby be electrically driven jointly via the first electrical connection pad of the carrier.

A third optoelectronic semiconductor chip may be arranged jointly with the first optoelectronic semiconductor chip at the top side of the carrier. In this case, the covering material is arranged such that a continuous section of the covering material extends over the top side of the first optoelectronic semiconductor chip and over a top side of the third optoelectronic semiconductor chip. Advantageously, in the optoelectronic component obtained by the method, the top side of the first optoelectronic semiconductor chip and the top side of the third optoelectronic semiconductor chip are then arranged in a common cavity configured in the housing material. The cavity may thereby bring about an intermixing of the electromagnetic radiation emitted by the first optoelectronic semiconductor chip and the third optoelectronic semiconductor chip.

A third optoelectronic semiconductor chip may be arranged jointly with the first optoelectronic semiconductor chip at the top side of the carrier. In this case, sections of the covering material that are physically separated from one another are arranged above the top side of the first optoelectronic semiconductor chip and above a top side of the third optoelectronic semiconductor chip. In the optoelectronic component obtained by the method, the top side of the first optoelectronic semiconductor chip and the top side of the third optoelectronic semiconductor chip are then arranged in cavities configured in the housing material that are separated from one another. This makes it possible to configure the cavities with a particularly small size.

The method may comprise a further step of arranging a further material above the covering material and/or the further covering material and/or the housing material. In this case, the further material may serve, for example, as an antireflection layer, a colored layer for coloration of the optoelectronic component obtainable by the method, a contrast enhancement or as an optical lens. The further material may also be configured such that it is roughened, laterally structured or multilayered.

The above-described properties, features and advantages and the way in which they are achieved will become clearer and more clearly understood in association with the following description of examples explained in greater detail in association with the drawings.

Figure 2:
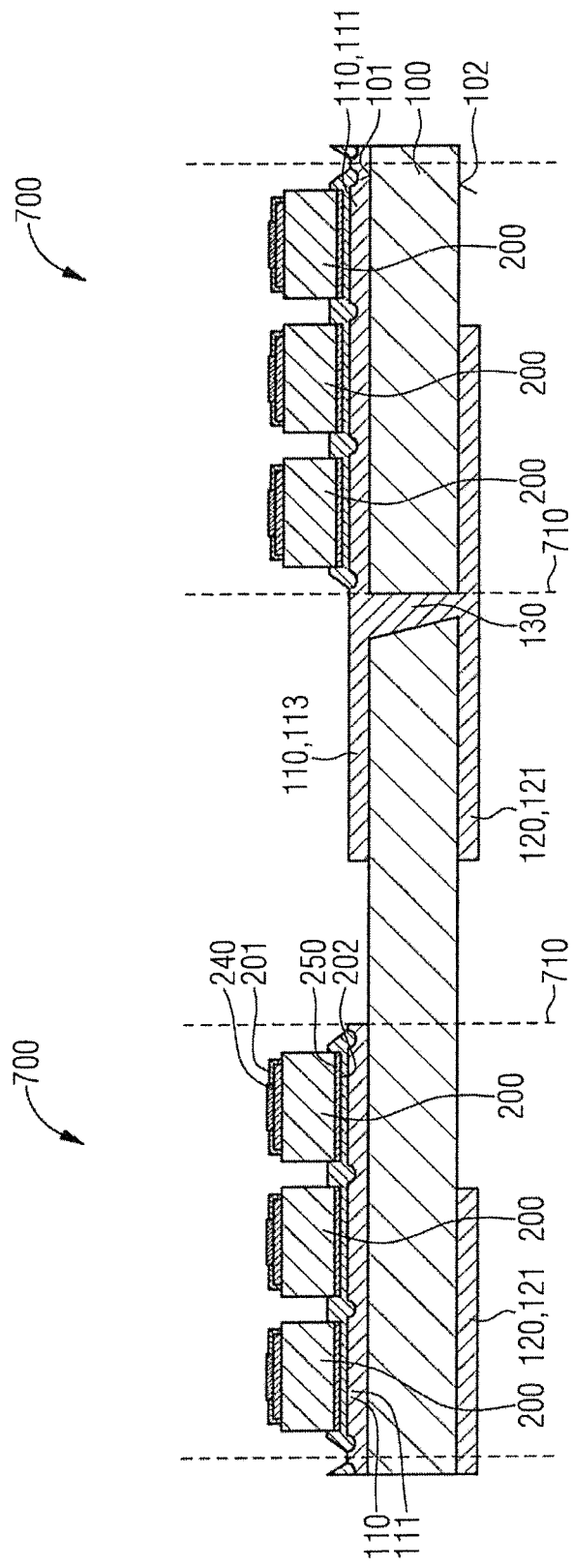
FIG. 2 schematically shows a first sectional side view of the carrier with the optoelectronic semiconductor chips arranged thereon.
Figure 3:
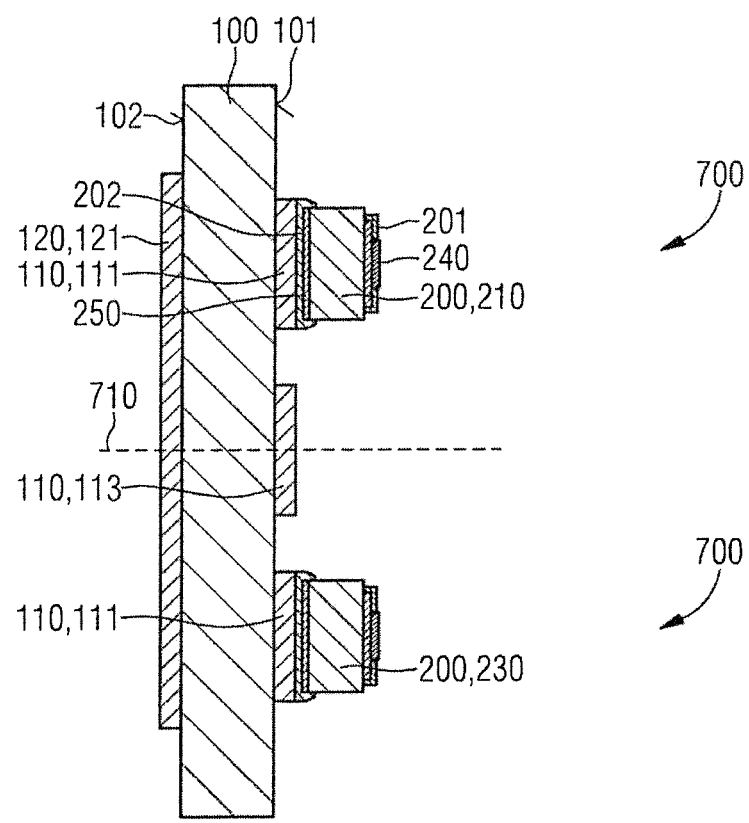
FIG. 3 schematically shows a second sectional side view of the carrier with the optoelectronic semiconductor chips arranged thereon.

FIG. 1 shows, in a schematic illustration, a plan view of a top side of a part of a carrier 100 provided to produce an optoelectronic component. FIG. 2 shows a schematic sectional side view of the carrier 100 in the processing state illustrated in FIG. 1. FIG. 3 shows a further schematic sectional side view of the carrier 100 in the processing state shown in FIG. 1. The sectional lines along which the carrier 100 is cut in the illustrations in FIGS. 2 and 3 are depicted in FIG. 1.

The optoelectronic component for whose production the carrier 100 is provided is configured by way of example as a video wall module in this description. A video wall module may serve as a module to construct a video wall. In this case, the video wall may comprise a multiplicity of video wall modules of identical type. The video wall may display static or moving mono- or polychromatic pictures.

Figure 4:
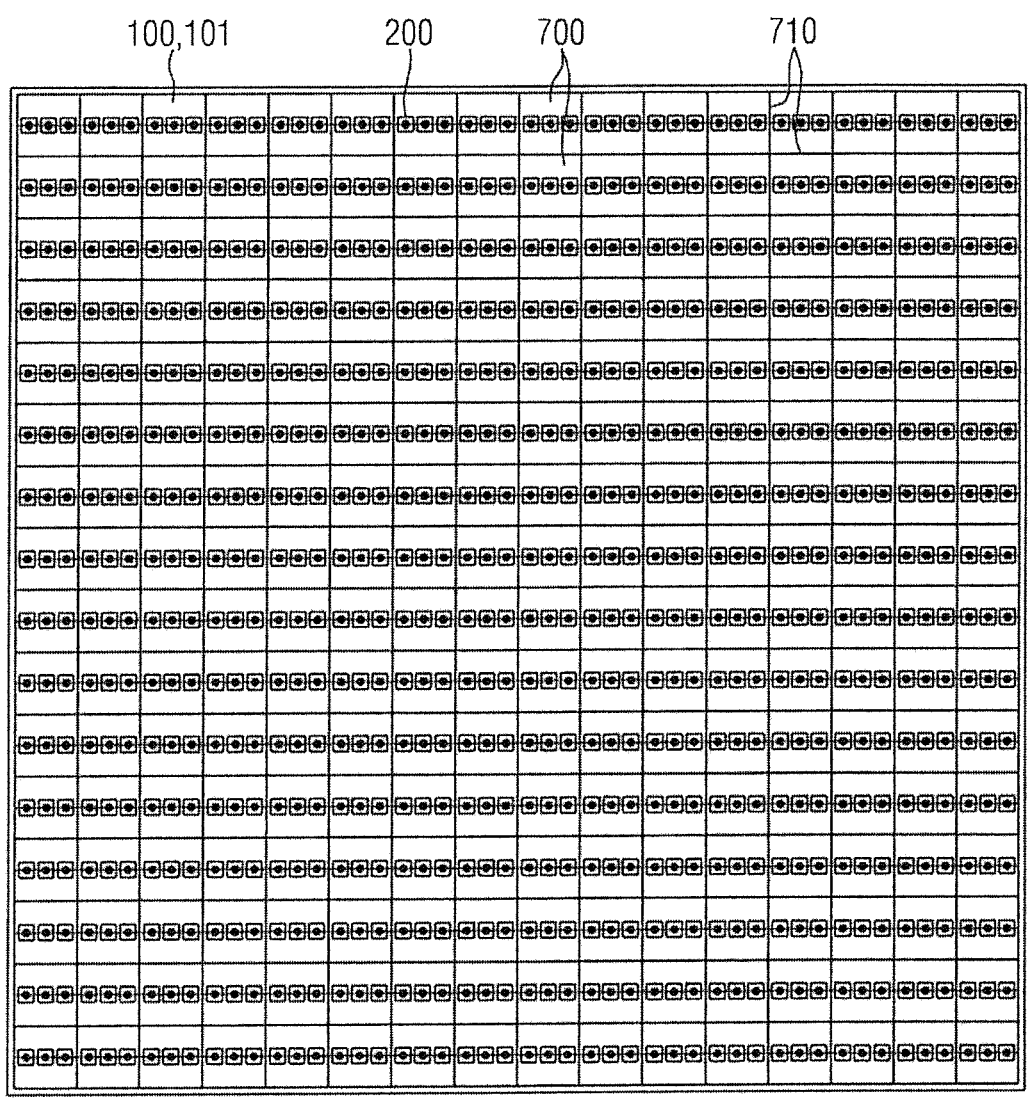
FIG. 4 schematically shows a plan view of the entire carrier.

FIG. 4 shows a highly schematic plan view of the top side 101 of the complete carrier 100 provided to produce a video wall module. The illustration in FIG. 4 is simplified and incomplete to illustrate the fundamental geometry of the video wall module.

The video wall module comprises a plurality of pixels 700 arranged in a regular, two-dimensional pixel raster 710. In the example shown in FIG. 4, the video wall module comprises 16×16 pixels 700. The pixel raster 710 thus comprises 16 columns and 16 rows. However, it is likewise possible to configure the video wall module with a different number of pixels 700, for example, with 8×8 pixels 700, with 4×4 pixels 700 or with 32×32 pixels 700. It is likewise possible for the number of rows of the pixel raster 710 to differ from the number of columns of the pixel raster 710. In this case, the video wall module may comprise, for example, 8×16 pixels 700.

The pixels 700 of the video wall module are configured in a square fashion in the example shown in FIG. 4. Since the pixel raster 710 is also square in the example shown in FIG. 4, the video wall module overall comprises a square shape. However, the pixels 700 could also be configured in a rectangular fashion. In this case, the video wall module may comprise a non-square rectangular shape. It is likewise possible to configure the pixels 700 with a non-square rectangular shape and configure the pixel raster 710 with a different number of rows and columns such that the video wall module overall comprises a square shape.

The individual pixels 700 of the video wall module may comprise an edge length which is, for example, 0.3 mm to 2 mm, in particular, for example, 0.5 mm to 1 mm. If the pixels 700 are configured in a square fashion, then they may thus comprise, for example, a size of 1 mm×1 mm. In this case, the video wall module may comprise, for example, an edge length of 16 mm. It may be expedient if the video wall module comprises a somewhat shorter edge length, for example, an edge length of 15.9 mm to compensate for tolerances.

Each pixel 700 of the video wall module comprises three optoelectronic semiconductor chips 200 in the example shown in FIG. 4. The optoelectronic semiconductor chips 200 are each configured to emit electromagnetic radiation, for example, visible light. The optoelectronic semiconductor chips 200 may be configured, for example, as light emitting diode chips (LED chips). The three optoelectronic semiconductor chips 200 of a pixel 700 may be configured to emit light of different colors. By way of example, the three optoelectronic semiconductor chips 200 of a pixel 700 may be configured to emit red, green and blue light. By additive mixing of the radiation emitted by the optoelectronic semiconductor chips 200 of a pixel 700, each pixel 700 is thus enabled to emit light with a color that is adjustable within wide limits.

However, it is likewise possible to configure the video wall module with a different number of optoelectronic semiconductor chips 200 per pixel 700. By way of example, each pixel 700 of the video wall module may comprise one optoelectronic semiconductor chip 200, two optoelectronic semiconductor chips 200 or more than three optoelectronic semiconductor chips 200. In this case, the optoelectronic semiconductor chips 200 may be configured, for example, to emit blue, green, yellow, red or orange light.

In the example shown in FIG. 4, the individual optoelectronic semiconductor chips 200 of a pixel 700 are arranged linearly alongside one another. In this case, the optoelectronic semiconductor chips 200 are arranged in rows such that all the optoelectronic semiconductor chips 200 of all the pixels 700 of a row of the pixel raster 710 of the video wall module are arranged in a common row. However, it is likewise possible to arrange the optoelectronic semiconductor chips 200 of a pixel 700 in columns such that all the optoelectronic semiconductor chips 200 of all the pixels 700 of a column of the pixel raster 710 of the video wall module are arranged in a common column. It is likewise possible to arrange the individual optoelectronic semiconductor chips 200 of a pixel 700 alongside one another in a different way than linearly, for example, in a triangular arrangement or a vertically offset arrangement. A linear arrangement of the individual optoelectronic semiconductor chips 200 of a pixel 700 of the video wall module may afford advantages in the image quality achievable by the video wall module.

The individual optoelectronic semiconductor chips 200 of a pixel 700 may comprise, for example, a spacing (semiconductor chip-to-semiconductor chip spacing) of 30 μm to 200 μm. In this case, the individual optoelectronic semiconductor chips 200 may comprise, for example, edge lengths that are 0.05 mm to 0.24 mm.

Figure 5:
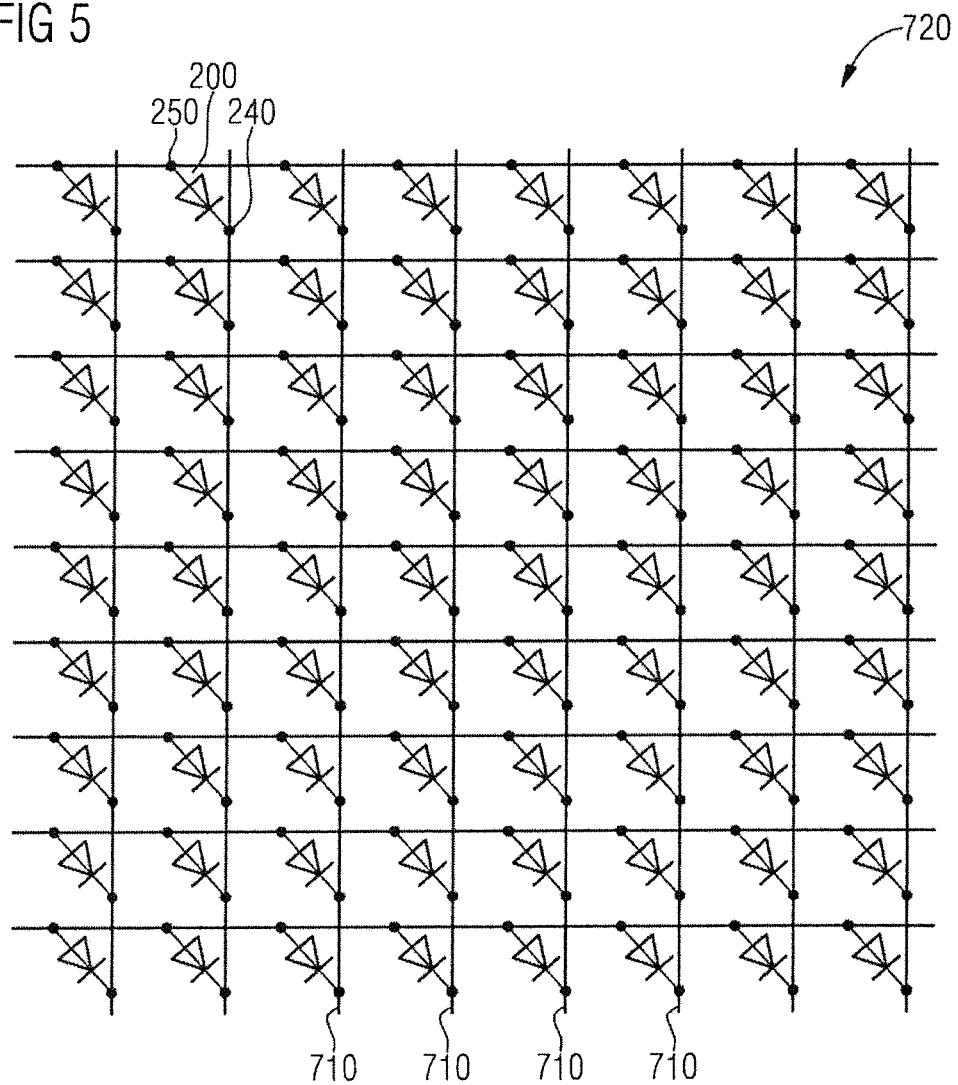
FIG. 5 schematically shows light emitting diodes arranged in a cross-matrix interconnection.

The optoelectronic semiconductor chips 200 of the video wall module are arranged in a cross-matrix interconnection 720, an excerpt from which is illustrated schematically in FIG. 5.

Each optoelectronic semiconductor chip 200 comprises a first electrical connection pad 240 and a second electrical connection pad 250. The first electrical connection pad 240 may be for example a cathode connection of the respective optoelectronic semiconductor chip 200. The second electrical connection pad 250 then forms an anode connection of the respective optoelectronic semiconductor chip 200.

The cross-matrix interconnection 720 comprises a logical matrix of logical rows and logical columns. The optoelectronic semiconductor chips 200 are distributed among the logical matrix of the cross-matrix interconnection 720 in such a way that one of the optoelectronic semiconductor chips 200 is arranged at each crossover of a logical row and a logical column. In this case, the second electrical connection pads 250 of all the optoelectronic semiconductor chips 200 of a logical row are electrically connected to one another by a row line of the cross-matrix interconnection 720. The first electrical connection pads 240 of all the optoelectronic semiconductor chips 200 of a logical column of the cross-matrix interconnection 720 are electrically conductively connected to one another by a column line of the cross-matrix interconnection 720.

The cross-matrix interconnection 720 makes it possible for all the optoelectronic semiconductor chips 200 of a row of the logical matrix to be simultaneously driven independently of one another. The optoelectronic semiconductor chips 200 of all the other rows of the logical matrix are not driven during this time. The individual rows of the logical matrix may be driven temporally successively (row multiplexing method) such that all the optoelectronic semiconductor chips 200 arranged in the cross-matrix interconnection 720 are addressed independently of one another in this way.

The logical rows and columns of the logical matrix of the cross-matrix interconnection may be oriented like the rows and columns of the pixel raster 710 of the video wall module. This enables all the optoelectronic semiconductor chips 200 of all the pixels 700 of a row of the pixel raster 710 of the video wall module to be driven simultaneously and independently of one another, while the individual rows of the pixel raster 710 are driven temporally successively. The individual optoelectronic semiconductor chips 200 of a pixel 700 here are each arranged in a common logical row of the logical matrix, but in separate logical columns of the logical matrix of the cross-matrix interconnection 720 such that the individual optoelectronic semiconductor chips 200 of a pixel 700 may be simultaneously driven independently of one another. The logical matrix of the cross-matrix interconnection 720 thus comprises, given three optoelectronic semiconductor chips 200 per pixel 700, three logical columns per column of the pixel raster 710. However, the rows and columns of the cross-matrix interconnection 720 may also be interchanged with respect to the rows and columns of the pixel raster 710.

The cross-matrix interconnection 720 makes it possible to drive the optoelectronic semiconductor chips 200 of the video wall module with a number of external contacts less than the sum of all the electrical connection pads 240, 250 of all the optoelectronic semiconductor chips 200 of the video wall module. Only one external contact per logical row of the cross-matrix interconnection 720 and one external contact per logical column of the cross-matrix interconnection 720 are required. In an exemplary video wall module comprising 16×16 pixels 700 and three optoelectronic semiconductor chips 200 per pixel 700, the cross-matrix interconnection 720 comprises 16 rows and 3×16 columns. In other words, 64 external contacts are thus required.

Figure 6:
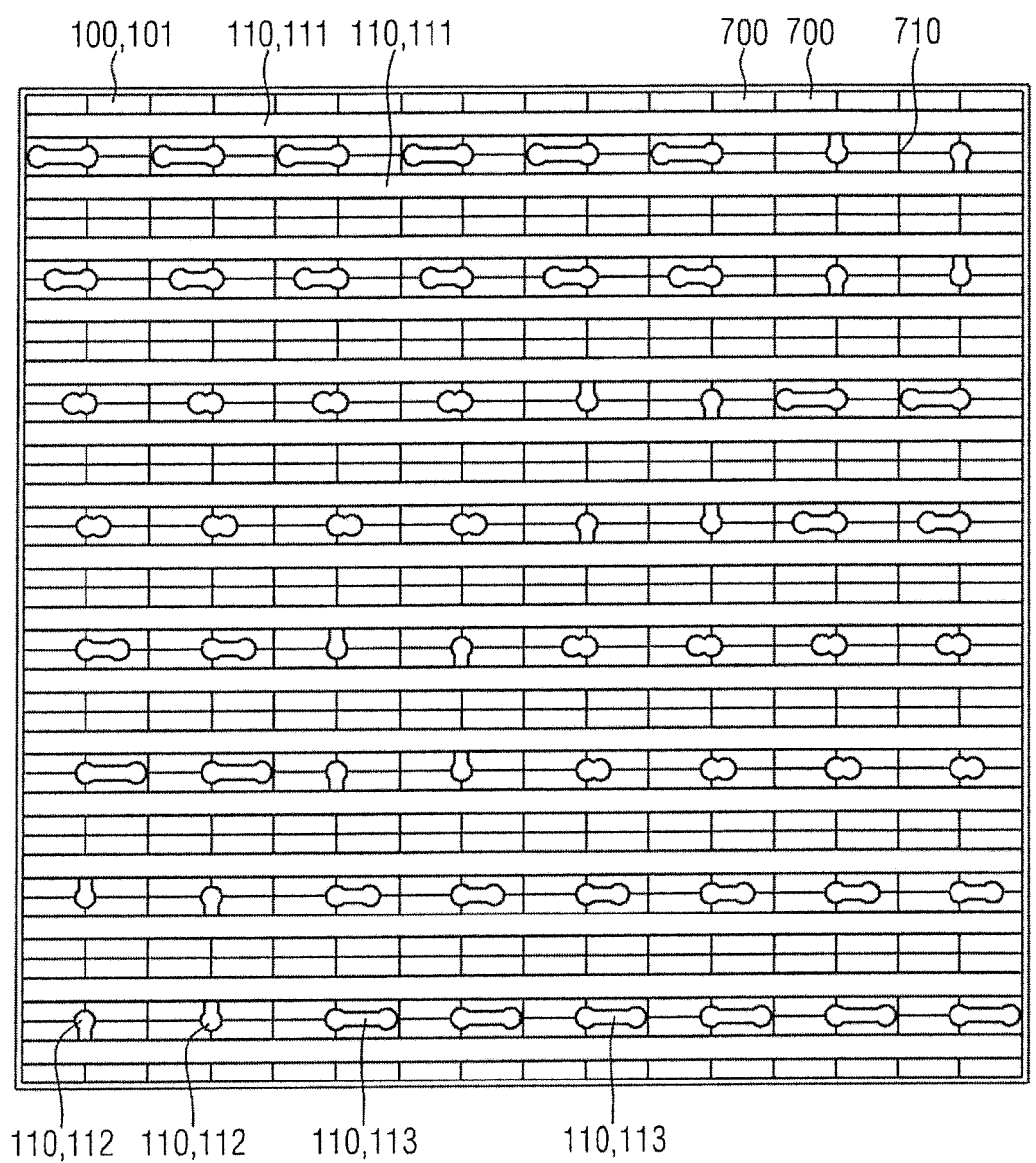
FIG. 6 schematically shows a plan view of an upper carrier metallization arranged at the top side of the carrier.
Figure 7:
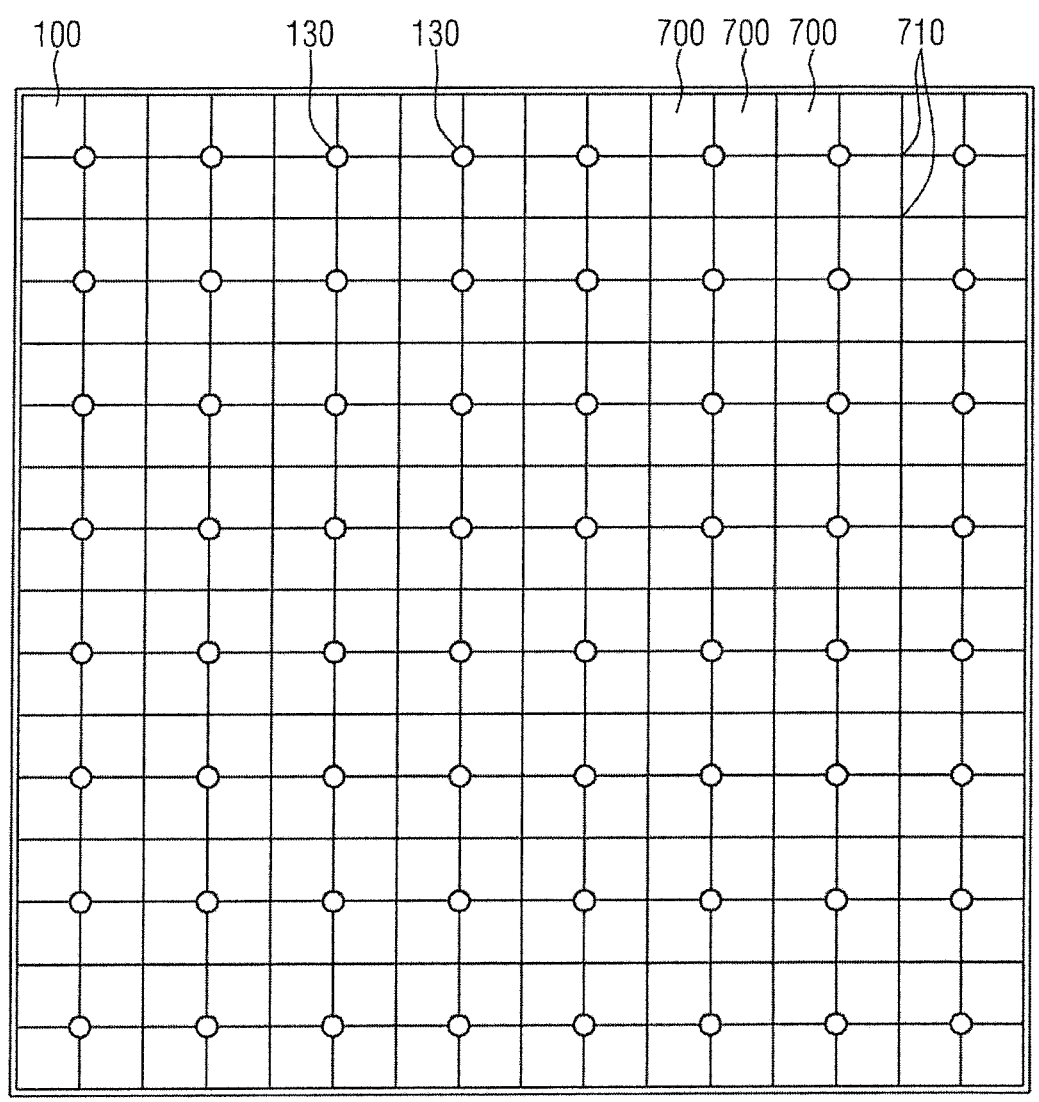
FIG. 7 schematically shows through contacts configured in the carrier.
Figure 8:
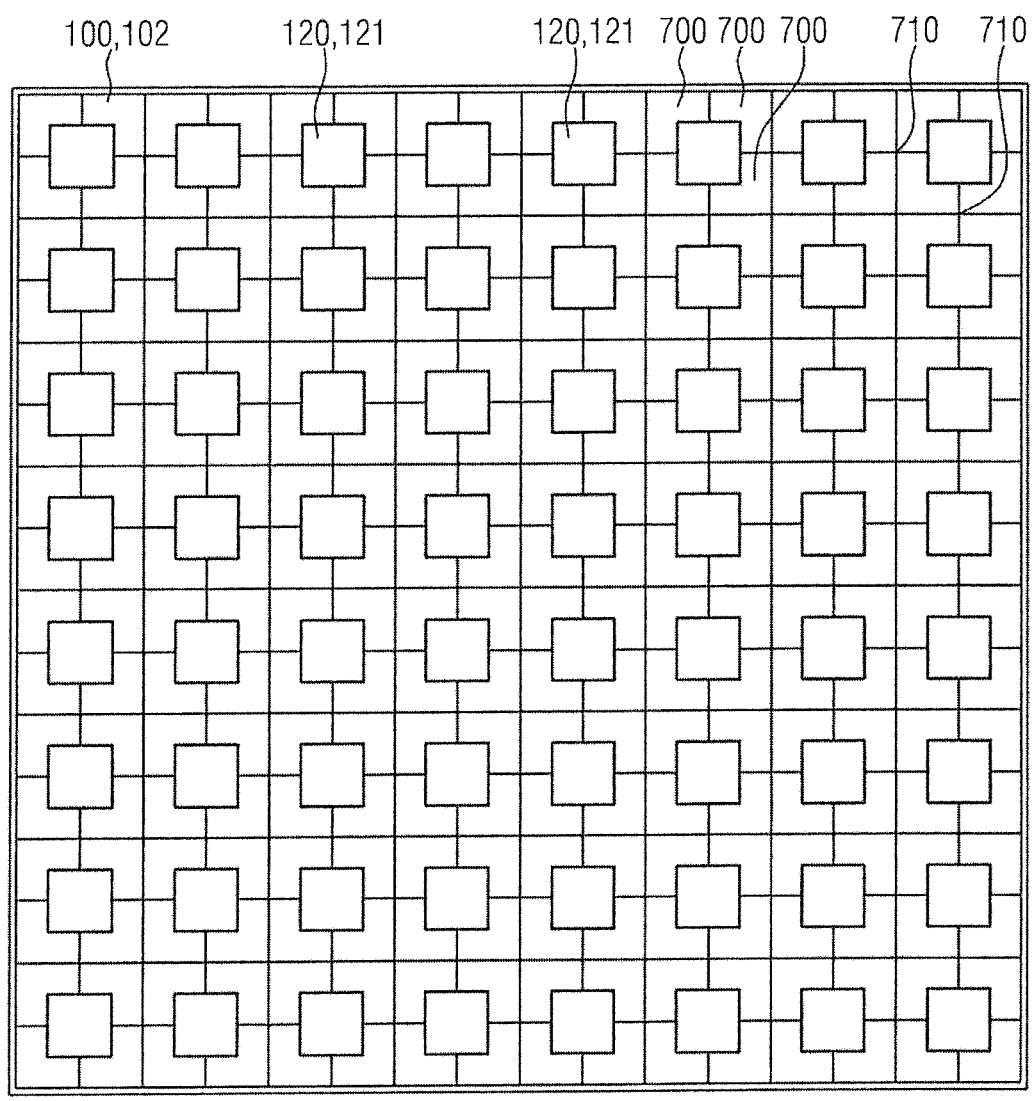
FIG. 8 schematically shows a plan view of a lower carrier metallization arranged at under underside of the carrier.

FIG. 6 shows, in a schematic illustration, a plan view of the top side 101 of the entire carrier 100. FIG. 7 shows, in a schematic illustration, a plan view of a sectional surface which is parallel to the top side 101 and which extends through the carrier 100. FIG. 8 shows, in a schematic illustration, a plan view of an underside 102 of the carrier 100, said underside being situated opposite the top side 101. The pixel raster 710 of the pixels 700 is depicted in each case in FIGS. 6, 7 and 8, and also in most of the other figures, to facilitate understanding.

The carrier 100 comprises an upper carrier metallization 110 at its top side 101 and a lower carrier metallization 120 at its underside 102. Between the upper carrier metallization 110 and the lower carrier metallization 120, the carrier 100 comprises an electrically insulating material, through which extend through contacts 130 which electrically conductively connect sections of the upper carrier metallization 110 to sections of the lower carrier metallization 120.

The electrically insulating material of the carrier 100 may comprise FR4, for example. Alternatively, however, the electrically insulating material of the carrier 100 may also comprise some other circuit board material from FR1 to FR4 or CEM1 to CEM4. The carrier 100 may also comprise a ceramic substrate, for example, $Al_2O_3$ or AlN. The carrier 100 may also be configured with a metal core.

The upper carrier metallization 110 comprises a plurality of parallel row lines 111 that form the row lines of the cross-matrix interconnection 720. The row lines 111 are aligned with the rows of the pixel raster 710. One row line 111 is present per row of the pixel raster 710. The respective row line 111 extends in each case over all the pixels 700 of the respective row of the pixel raster 710. The individual row lines 111 of the upper carrier metallization 110 are electrically insulated from one another.

The upper carrier metallization 110 of the carrier 100 additionally comprises row connection structures 112 and column connection structures 113 arranged between the row lines 111. The row connection structures 112 are electrically conductively connected to the row lines 111. In this case, each row line 111 connects to a row connection structure 112 and each row connection structure 112 connects to a row line 111. The upper carrier metallization 110 comprises three column connection structures 113 per column of the pixel raster 710. Thus, a dedicated column connection structure 113 is assigned to each sub-column formed by the three optoelectronic semiconductor chips 200 per pixel 700, or to each logical column of the cross-matrix interconnection 720. The column connection structures 113 are electrically insulated from one another, from the row lines 111 and from the row connection structures 112.

FIG. 7 shows the through contacts 130 extending from the top side 101 to the underside 102 through the carrier 100. The through contacts 130 are arranged at nodes of the pixel raster 710 at which in each case two adjacent rows and two adjacent columns of the pixel raster 710 meet. 2×2 adjacent pixels 700 each form a group of associated pixels 700. The exemplary pixel raster 710 comprising 16×16 pixels 700 thus comprises 8×8 groups of this type. A through contact 130 is arranged at each node of the pixel raster 710 at which four pixels 700 of a group of pixels 700 adjoin one another. The carrier 100 thus comprises 8×8 through contacts 130 in the example illustrated.

Each row connection structure 112 and each column connection structure 113 of the upper carrier metallization 110 of the carrier 100 is electrically conductively connected to exactly one of the through contacts 130 of the carrier 100. Each through contact 130 of the carrier 100 is electrically conductively connected to exactly one row connection structure 112 or exactly one column connection structure 113.

The lower carrier metallization 120 of the carrier 100, as shown in FIG. 8, comprises a plurality of contact pads 121. In the example illustrated, the lower carrier metallization 120 comprises 8×8 contact pads 121. In this case, like the through contacts 130 of the carrier 100, the contact pads 121 are arranged at the nodes of the pixel raster 710 at which the four pixels 700 of an associated group of pixels 700 in each case adjoin one another. Each contact pad 121 is electrically conductively connected to exactly one through contact 130. In the example illustrated, the contact pads 121 in each case comprise a square shape, but might, for example, also each comprise a circular disk shape or some other shape.

The positions of the through contacts 130 of the carrier 100 and the positions of the contact pads 121 of the lower carrier metallization 120 of the carrier 100 might also be shifted relative to the positions shown in FIGS. 7 and 8. All that is essential is that each row connection structure 112 of the upper carrier metallization 110 is electrically conductively connected to a contact pad 121 of the lower carrier metallization 120 via one of the through contacts 130 and also each column connection structure 113 of the upper carrier metallization 110 is electrically conductively connected to one of the contact pads 121 of the lower carrier metallization 120 via one of the through contacts 130. In this case, each contact pad 121 of the lower carrier metallization 120 is connected to exactly one row connection structure 112 or one column connection structure 113 via exactly one through contact 130.

Preferably, all the contact pads 121 of the lower carrier metallization 120 are the same size. The contact pads 121 of the lower carrier metallization 120 of the carrier 100 may form a land grid array. In this case, the individual contact pads 121 are preferably at a distance of more than 250 μm from one another.

To produce the optoelectronic component, for example the video wall module, the optoelectronic semiconductor chips 200 are arranged at the top side 101 of the carrier 100. FIGS. 1 to 3 show the processing state attained as a result.

Three optoelectronic semiconductor chips 200 per pixel 700 of the pixel raster 710 are arranged at the top side 101 of the carrier 100. The three optoelectronic semiconductor chips 200 of each pixel 700 may be provided, for example, to emit electromagnetic radiation comprising a wavelength from the blue, from the green and from the red spectral range.

Each optoelectronic semiconductor chip 200 comprises a top side 201 and an underside 202 situated opposite the top side 201. In this case, the first electrical connection pad 240 of the optoelectronic semiconductor chip 200 is arranged at the top side 201 thereof. The second electrical connection pad 250 is arranged at the underside 202. The top sides 201 of the optoelectronic semiconductor chips 200 form radiation emission faces of the optoelectronic semiconductor chips 200. During operation of the optoelectronic semiconductor chips 200, electromagnetic radiation generated by the optoelectronic semiconductor chips 200 is emitted at the top sides 201 of the optoelectronic semiconductor chips 200. In this case, the emitted electromagnetic radiation is substantially centered about a direction perpendicular to the top sides 201.

The optoelectronic semiconductor chips 200 are arranged on the row lines 111 of the upper carrier metallization 110 of the carrier 100. In this case, the optoelectronic semiconductor chips 200 are arranged such that the undersides 202 of the optoelectronic semiconductor chips 200 face the top side 101 of the carrier 100 and the second electrical connection pads 250 arranged at the undersides 202 of the optoelectronic semiconductor chips 200 are electrically conductively connected to the row lines 111. For this purpose, the optoelectronic semiconductor chips 200 may be secured to the row lines 111 of the upper carrier metallization 110, for example, by a solder or an electrically conductive adhesive.

In the example shown in FIGS. 1 to 3, the optoelectronic semiconductor chips 200 arranged at the top side 101 of the carrier 100 comprise a first optoelectronic semiconductor chip 210, a second optoelectronic semiconductor chip 220 and a third optoelectronic semiconductor chip 230. The first optoelectronic semiconductor chip 210 and the second optoelectronic semiconductor chip 220 are arranged alongside one another in a common pixel 700 of the pixel raster 710. The third optoelectronic semiconductor chip 230 is arranged in a pixel 700 adjacent to the pixel 700 of the first optoelectronic semiconductor chip 210 and arranged in the same column and an adjacent row of the pixel raster 710. The first optoelectronic semiconductor chip 210 and the third optoelectronic semiconductor chip 230 are each arranged in the center of their pixels 700 such that the first optoelectronic semiconductor chip 210 and the third optoelectronic semiconductor chip 230 are situated in a common sub-column of said column of the pixel raster. The second optoelectronic semiconductor chip 220 is arranged in an adjacent sub-column of the column of the pixel raster 710.

Figure 9:
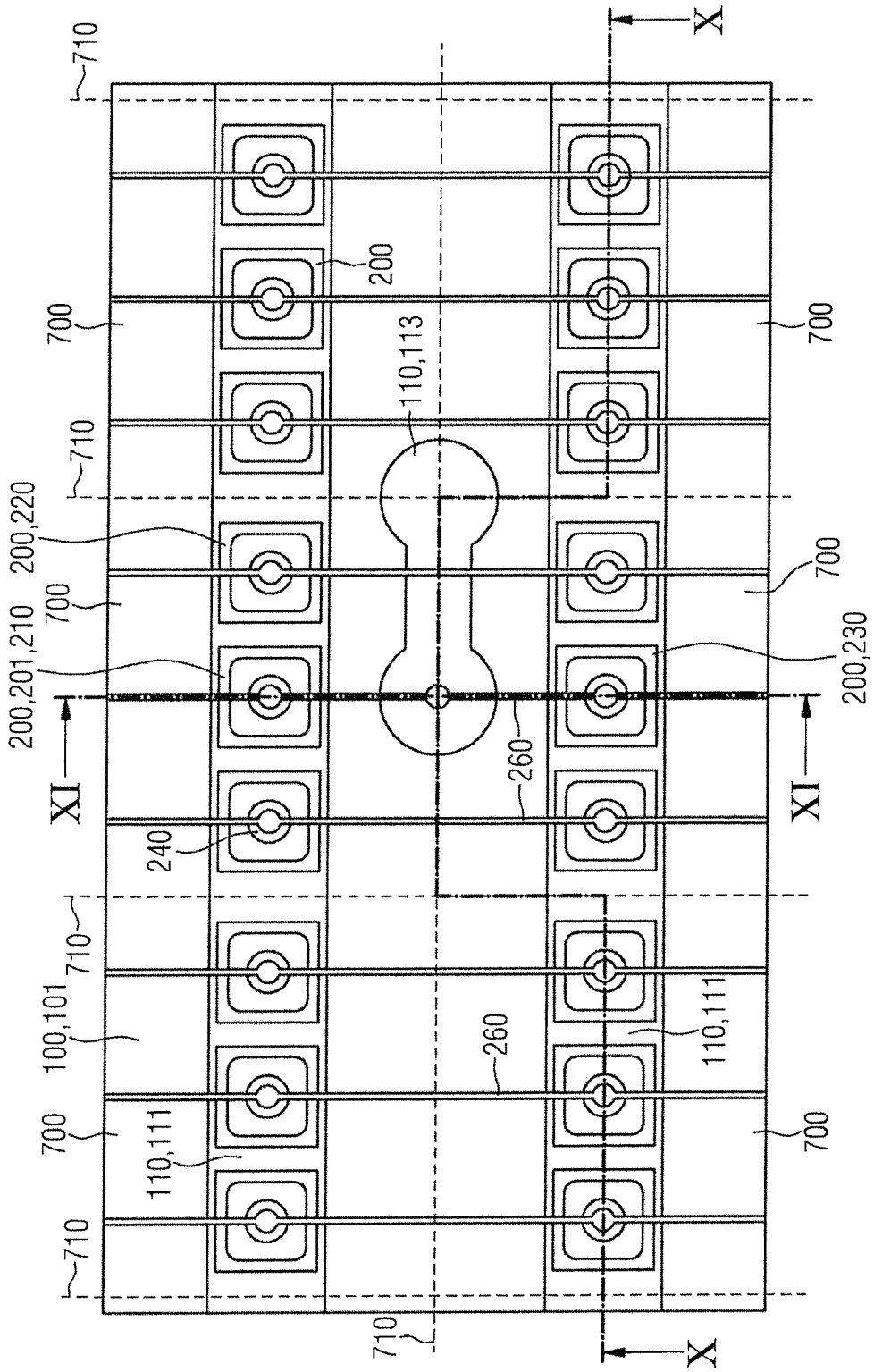
FIG. 9 schematically shows a plan view of a part of the top side of the carrier with the optoelectronic semiconductor chips arranged thereon after the process of producing bond wire connections.
Figure 10:
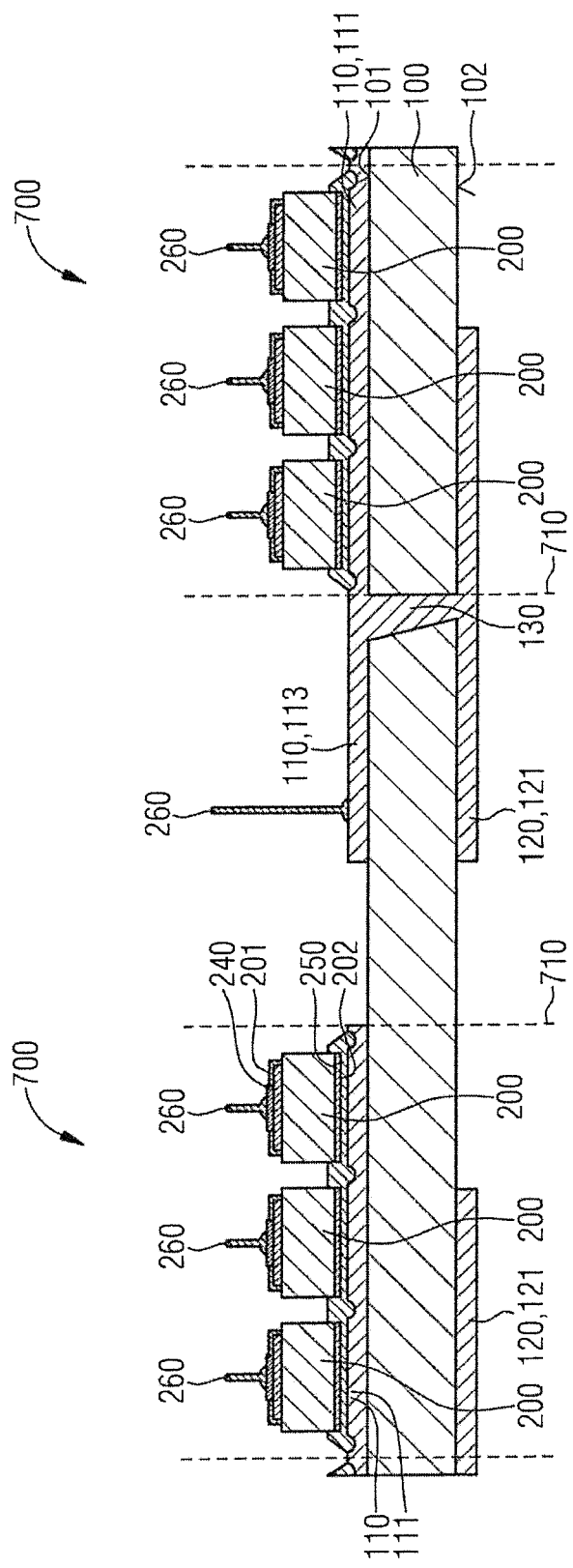
FIG. 10 schematically shows a first sectional side view of the carrier in the processing state shown in FIG. 9.
Figure 11:
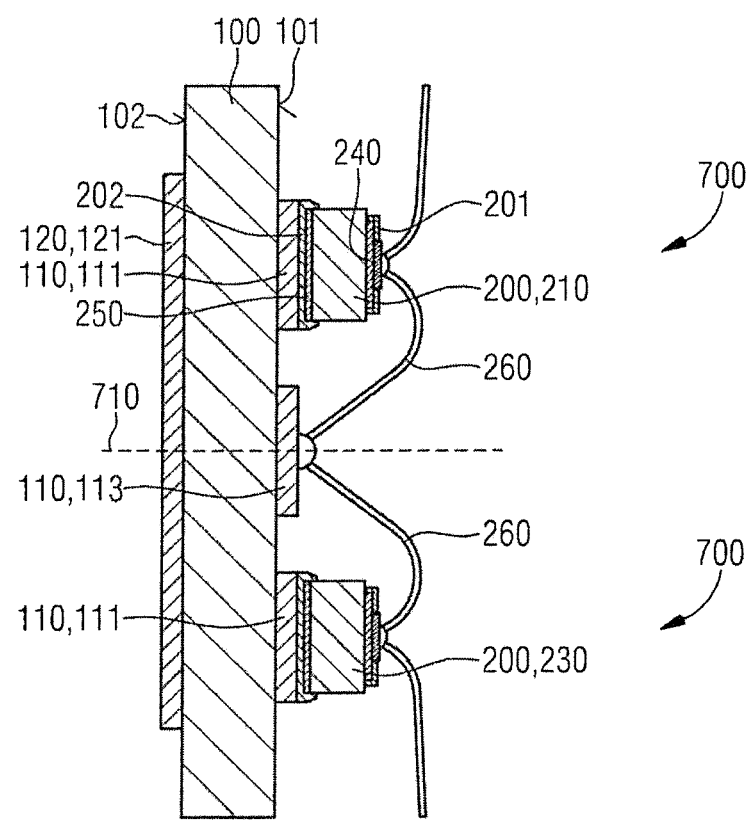
FIG. 11 schematically shows a second sectional side view of the carrier in the processing state shown in FIG. 9.

FIG. 9 shows a schematic plan view of the top side 101 of the carrier 100 in a processing state temporally succeeding the illustration in FIGS. 1 to 3. FIGS. 10 and 11 show schematic sectional side views of the carrier 100 in the processing state shown in FIG. 9.

The first electrical connection pads 240 of the optoelectronic semiconductor chips 200 have been electrically conductively connected to one another column by column via bond wires 260. The bond wires 260 thus form the column lines of the cross-matrix interconnection 720 from FIG. 5. Each sub-column of each column of the pixel raster 710, that is to say each logical column of the cross-matrix interconnection 720, has been through-connected separately via bond wires 260. Consequently, the first electrical connection pad 240 of the first optoelectronic semiconductor chip 210 has been electrically conductively connected to the first electrical connection pad 240 of the third optoelectronic semiconductor chip 230 via a bond wire 260. By contrast, the first electrical connection pad 240 of the second optoelectronic semiconductor chip 220 has not been connected either to the first electrical connection pad 240 of the first optoelectronic semiconductor chip 210 or to the first electrical connection pad 240 of the third optoelectronic semiconductor chip 230.

In addition, each column line formed by bond wires 260 has been electrically conductively connected to at least one column connection structure 113 of the upper carrier metallization 110. Consequently, the first electrical connection pad 240 of the first optoelectronic semiconductor chip 210 and the first electrical connection pad 240 of the third optoelectronic semiconductor chip 230 have both been connected to one of the column connection structures 113 of the upper carrier metallization 110. In the example shown in FIGS. 9 to 11, the column connection structure 113 is arranged between the first optoelectronic semiconductor chip 210 and the third optoelectronic semiconductor chip 230. In each case one or a plurality of bond wires 260 extend from the first electrical connection pad 240 of the first optoelectronic semiconductor chip 210 to the column connection structure 113 and from the column connection structure 113 to the first electrical connection pad 240 of the third optoelectronic semiconductor chip 230.

The bond wires 260 between the optoelectronic semiconductor chips 200 may each extend directly from the first electrical connection pad 240 of an optoelectronic semiconductor chip 200 to the first electrical connection pad 240 of the closest optoelectronic semiconductor chip 200. However, the bond wires 260 may also extend between the first electrical connection pads 240 of the optoelectronic semiconductor chips 200 of adjacent rows in each case to the top side 101 of the carrier 100.

The individual sections of each column line formed by bond wires 260, that is to say the sections between the first electrical connection pads 240 of the various optoelectronic semiconductor chips 200 and/or the sections between the electrical connection pads 240 and the top side 101 of the carrier 100, may be formed in each case by individual bond wires 260 or by a single continuous bond wire 260 per column line. The connections between the bond wires 260 and the first electrical connection pads 240 and the connections between the bond wires 260 and the column connection structures 113 may be, for example, ball bond connections or wedge bond connections. Preferably, the bond wires 260 comprise the least possible extent in terms of height in a direction perpendicular to the top side 101 of the carrier 100. The bond wires 260 may comprise an extent of, for example, less than 150 µm or even less than 50 µm in terms of height.

Figure 12:
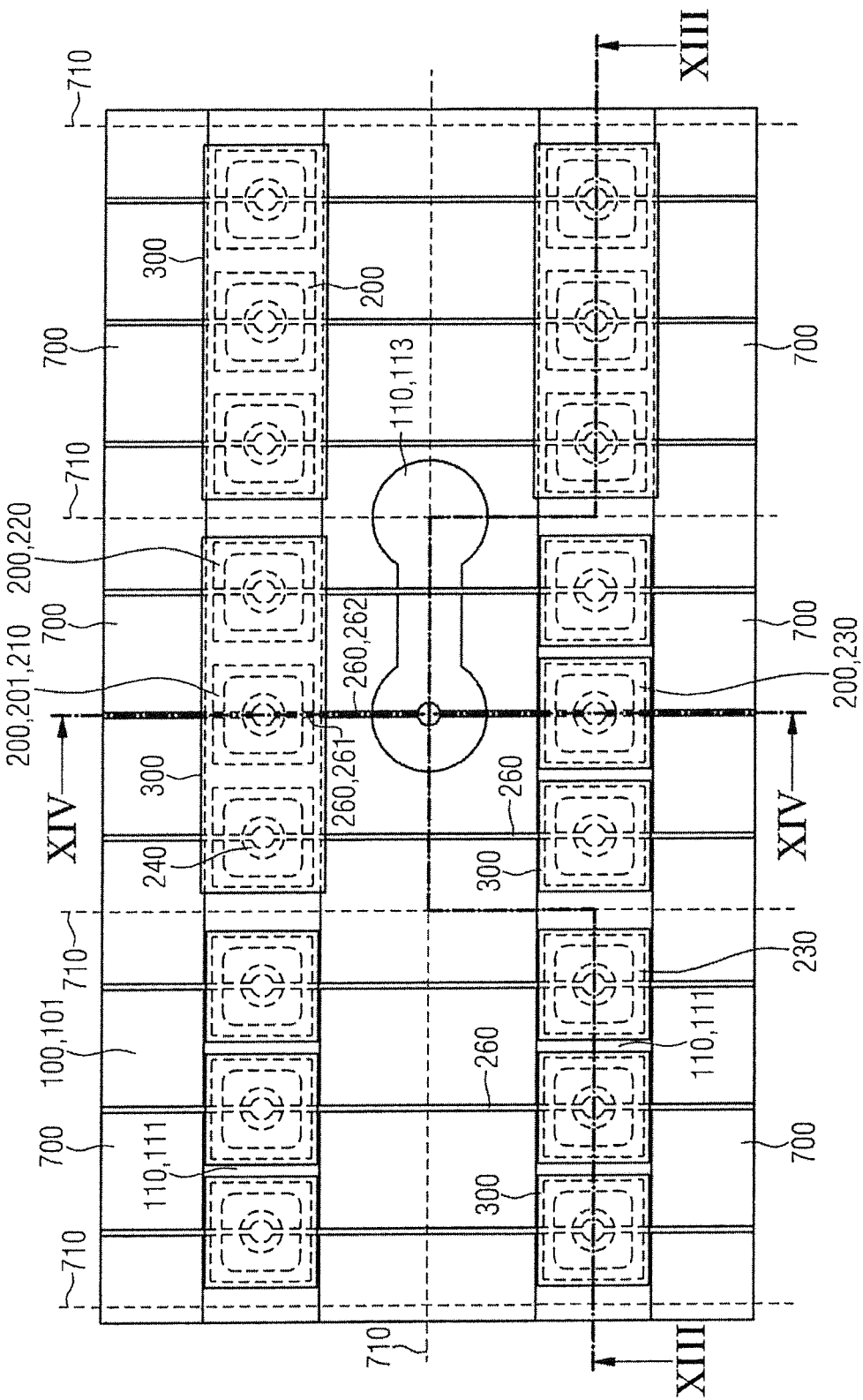
FIG. 12 schematically shows a plan view of the top side of the carrier and the optoelectronic semiconductor chips arranged thereon after the process of arranging a covering material above top sides of the optoelectronic semiconductor chips.
Figure 13:
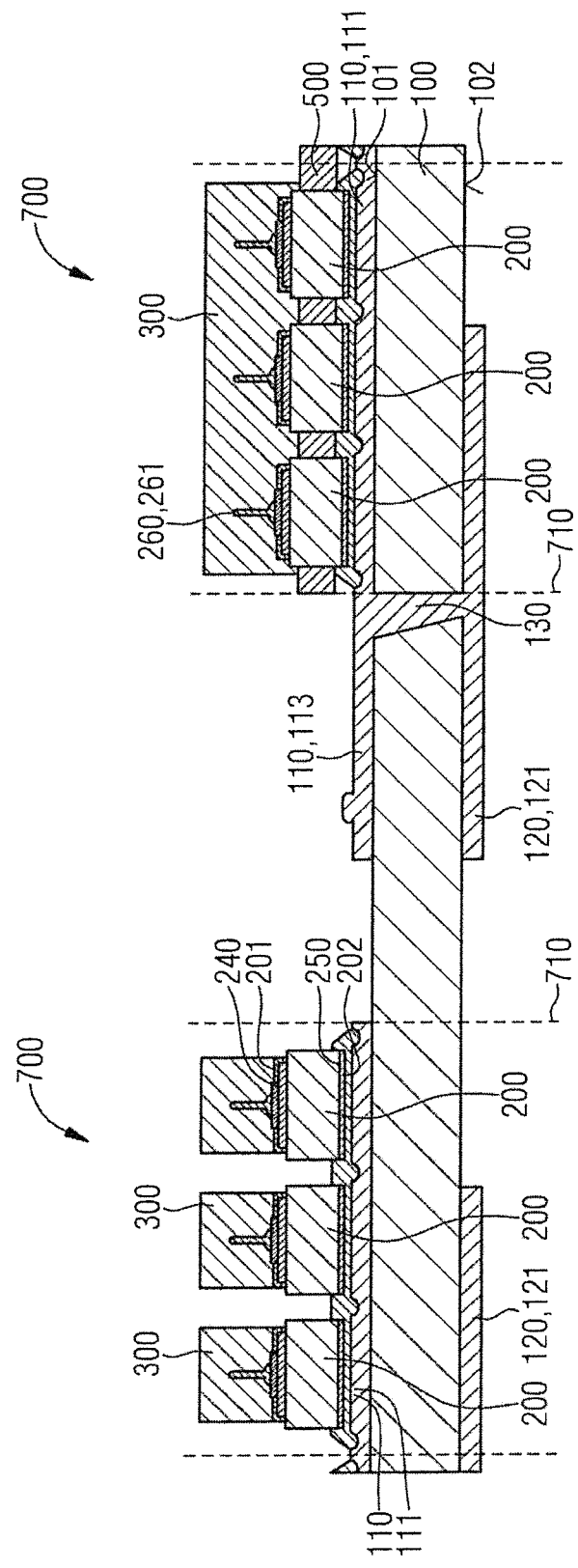
FIG. 13 schematically shows a first sectional side view of the carrier in the processing state shown in FIG. 12.
Figure 14:
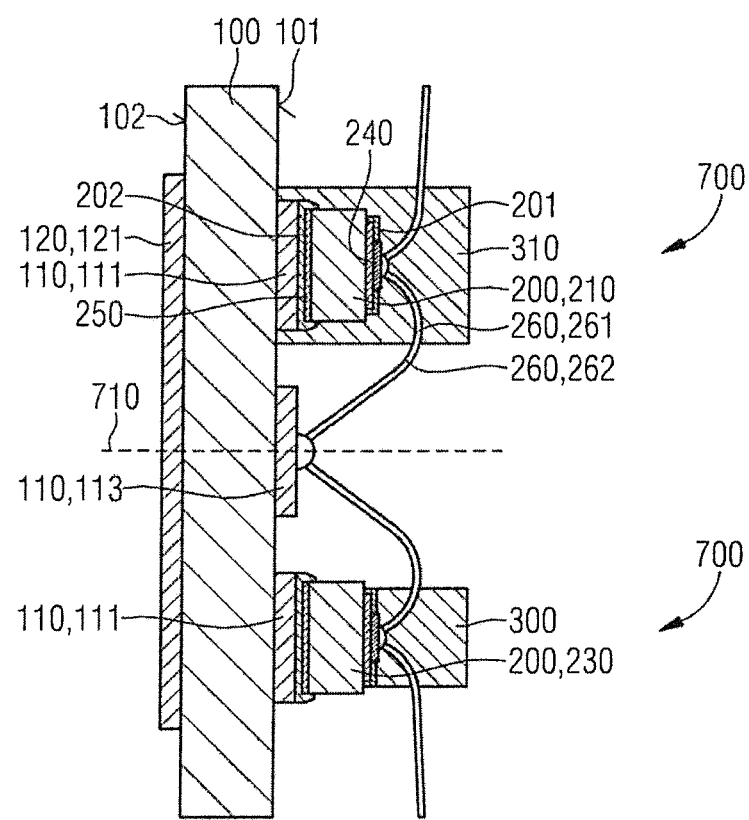
FIG. 14 schematically shows a second sectional side view of the carrier in the processing state shown in FIG. 12.

FIG. 12 shows a schematic plan view of the top side 101 of the carrier 100 and the optoelectronic semiconductor chips 200 arranged on the top side 101 of the carrier 100 in a processing state temporally succeeding the illustration in FIGS. 9 to 11. FIGS. 13 and 14 show schematic sectional side views of the carrier 100 and of the optoelectronic semiconductor chips 200 in the processing state shown in FIG. 12.

A covering material 300 has been arranged at the top sides 201 of the optoelectronic semiconductor chips 200. The covering material 300 at least partly covers the top sides 201 of the optoelectronic semiconductor chips 200. The covering material 300 may also extend beyond the top sides 201 of the optoelectronic semiconductor chips 200 and cover parts of the top side 101 of the carrier 100 in the vicinity of the optoelectronic semiconductor chips 200 and/or side faces of the optoelectronic semiconductor chips 200 that extend between the top sides 201 and the undersides 202 of the optoelectronic semiconductor chips 200.

The covering material 300 is subdivided into a plurality of sections physically separated from one another. The sections of the covering material 300 arranged above the individual pixels 700 of the pixel raster 710 are physically separated from one another. A single continuous section of the covering material 300 may each be arranged above the top sides 201 of the three optoelectronic semiconductor chips 200 of a pixel 700, the section jointly covering the top sides 201 of the three optoelectronic semiconductor chips 200, as illustrated by way of example in the pixel 700 comprising the first optoelectronic semiconductor chip 210. In this case, the covering material 300 between the optoelectronic semiconductor chips 200 may also cover parts of the top side 101 of the carrier 100. Alternatively, however, a dedicated section of the covering material 300 may each also be arranged above the top side 201 of each optoelectronic semiconductor chip 200 of a single pixel 700, the dedicated section being physically separated from the sections of the covering material 300 arranged above the top sides 201 of all the other optoelectronic semiconductor chips 200. This is shown by way of example in the pixel 700 comprising the third optoelectronic semiconductor chip 230. In this case, too, the sections of the covering material 300 may each extend beyond the top side 201 of the optoelectronic semiconductor chip 200 and cover parts of the top side 101 of the carrier 100. However, the sections of the covering material 300 may also be delimited to the top sides 201 of the optoelectronic semiconductor chips 200.

The covering material 300 may comprise a photoresist or some other photopatternable material, for example, ORMOCER or silicone. The covering material 300, in a first step, may have been arranged in a planar fashion above the top side 101 of the carrier 100 and above the top sides 201 of the optoelectronic semiconductor chips 200 and may then have been delimited to the sections shown in FIGS. 12 to 14 by a photopatterning method, the covering material having been removed in the other sections. The process of applying the covering material 300 in a planar fashion may have been carried out, for example, by spin coating, spraying, a metering method or lamination. The process of applying the covering material 300 in a planar fashion may have been carried out in one or more steps. The covering material 300 may also have been patterned by a laser patterning method or some other patterning method instead of by a photopatterning method. The covering material 300 may also have been applied already in patterned form, for example, by lamination of a patterned film or by a 3D printing method.

Before arranging the covering material 300, an optically absorbing material 500 may have been arranged at the top side 101 of the carrier 100. The optically absorbing material 500 may completely or partly cover the top side 101 of the carrier 100, but does not cover the top sides 201 of the optoelectronic semiconductor chips 200. However, the optically absorbing material 500 may cover the side faces of the optoelectronic semiconductor chips 200 extending between the top sides 201 and the undersides 202 of the optoelectronic semiconductor chips 200. The optoelectronic semiconductor chips 200 are then at least partly embedded into the optically absorbing material 500. The optically absorbing material 500 is shown by way of example in the right-hand part of FIG. 13.

The optically absorbing material 500 may have been applied and patterned, for example, by a photopatterning method.

If the optically absorbing material 500 has been arranged before the process of arranging the covering material 300 at the top side 101 of the carrier 100, then the covering material 300 is at least partly arranged on the optically absorbing material 500. The optically absorbing material 500 is then at least partly covered by the covering material 300.

The optically absorbing material 500 may serve, in the finished optoelectronic component, for example, the video wall module to increase an optical contrast between the radiation-emitting top sides 201 of the optoelectronic semiconductor chips 200 and the sections of the top side 101 of the carrier 100 that surround the top sides 201 of the optoelectronic semiconductor chip 200. The optically absorbing material 500 may also facilitate a photopatterning of the covering material 300 by virtue of a reduction of stray light.

Since the covering material 300 at least partly covers the top sides 201 of the optoelectronic semiconductor chips 200 and thus also the first electrical contact pads 240 of the optoelectronic semiconductor chips 200, the first electrical contact pads being arranged at the top sides 201 of the optoelectronic semiconductor chips 200, first sections 261 of the bond wires 260 connected to the first electrical connection pads 240 of the optoelectronic semiconductor chips 200 are also embedded into the covering material 300. The covering material 300 is applied such that the bond wires 260 are not damaged in the process.

In the finished optoelectronic component, the covering material 300 may remain above the top sides 201 of the optoelectronic semiconductor chips 200. In this case, the covering material 300 may expediently comprise a high transparency. The covering material 300 may comprise a transmittance of at least 10%, for example, for electromagnetic radiation comprising a wavelength from at least one part of the ultraviolet to infrared spectral range.

In this case, the covering material 300 may additionally comprise embedded particles, for example, wavelength-converting particles, scattering particles and/or absorbing particles. Wavelength-converting particles embedded into the covering material 300 may be provided for at least partly converting electromagnetic radiation emitted by the optoelectronic semiconductor chips 200 into electromagnetic radiation comprising a different wavelength. Scattering particles embedded into the covering material may be provided to diffuse scatter electromagnetic radiation emitted by the optoelectronic semiconductor chips 200 to achieve a good intermixing of the electromagnetic radiation emitted by different optoelectronic semiconductor chips 200 and/or to achieve a homogeneous and/or isotropic emission by the optoelectronic component. Scattering particles embedded into the covering material 300 may also reduce the visibility of the individual optoelectronic semiconductor chips 200 and/or of the bond wires 260 from outside the optoelectronic component. Absorbing particles embedded into the covering material 300 may also be used for this purpose.

The covering material 300 may alternatively also be removed in a subsequent processing step. In this case, the covering material 300 need not be configured in a transparent fashion.

Figure 15:
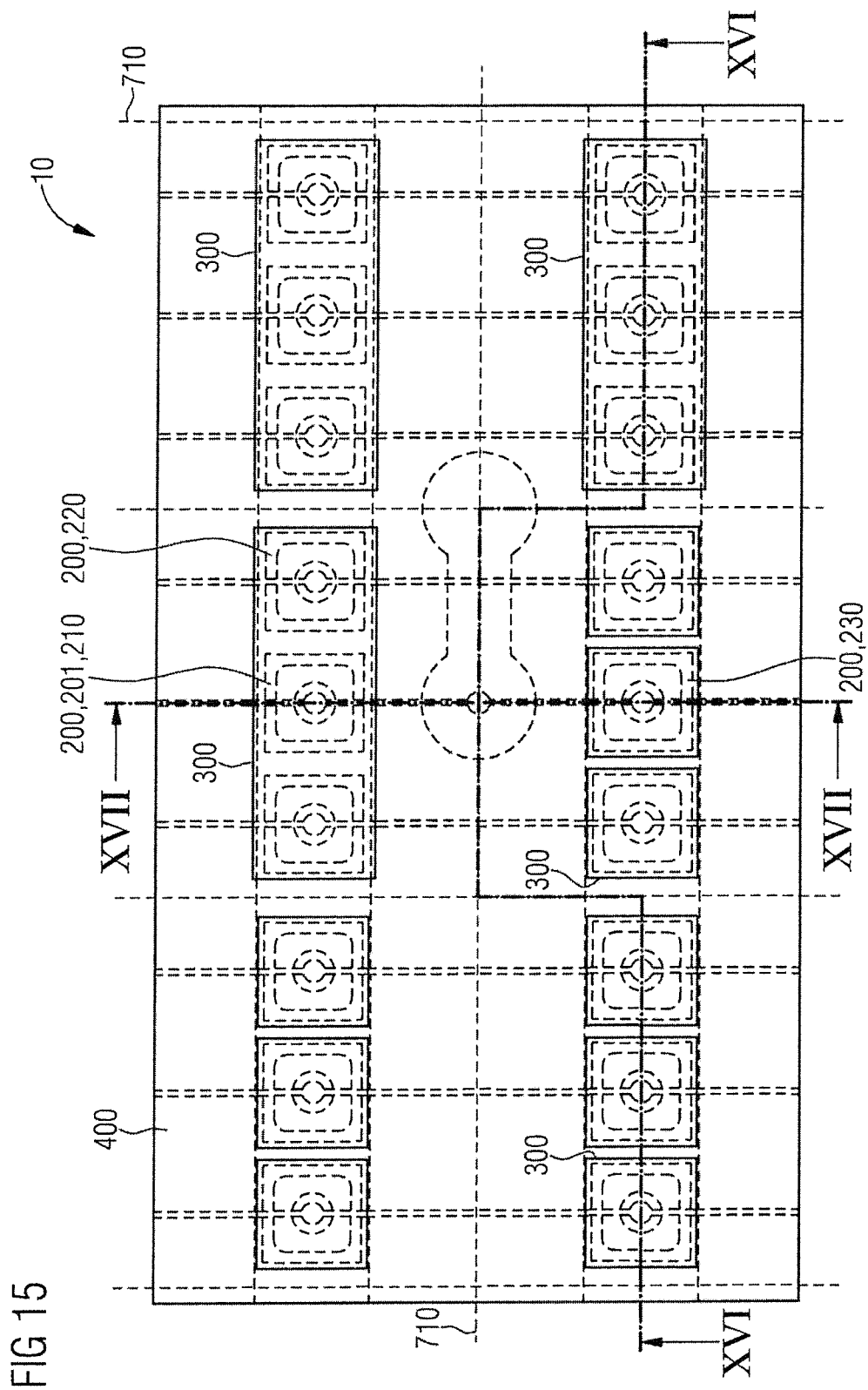
FIG. 15 schematically shows a plan view of the carrier and the optoelectronic semiconductor chips after the process of arranging a housing material above the top side of the carrier.
Figure 16:
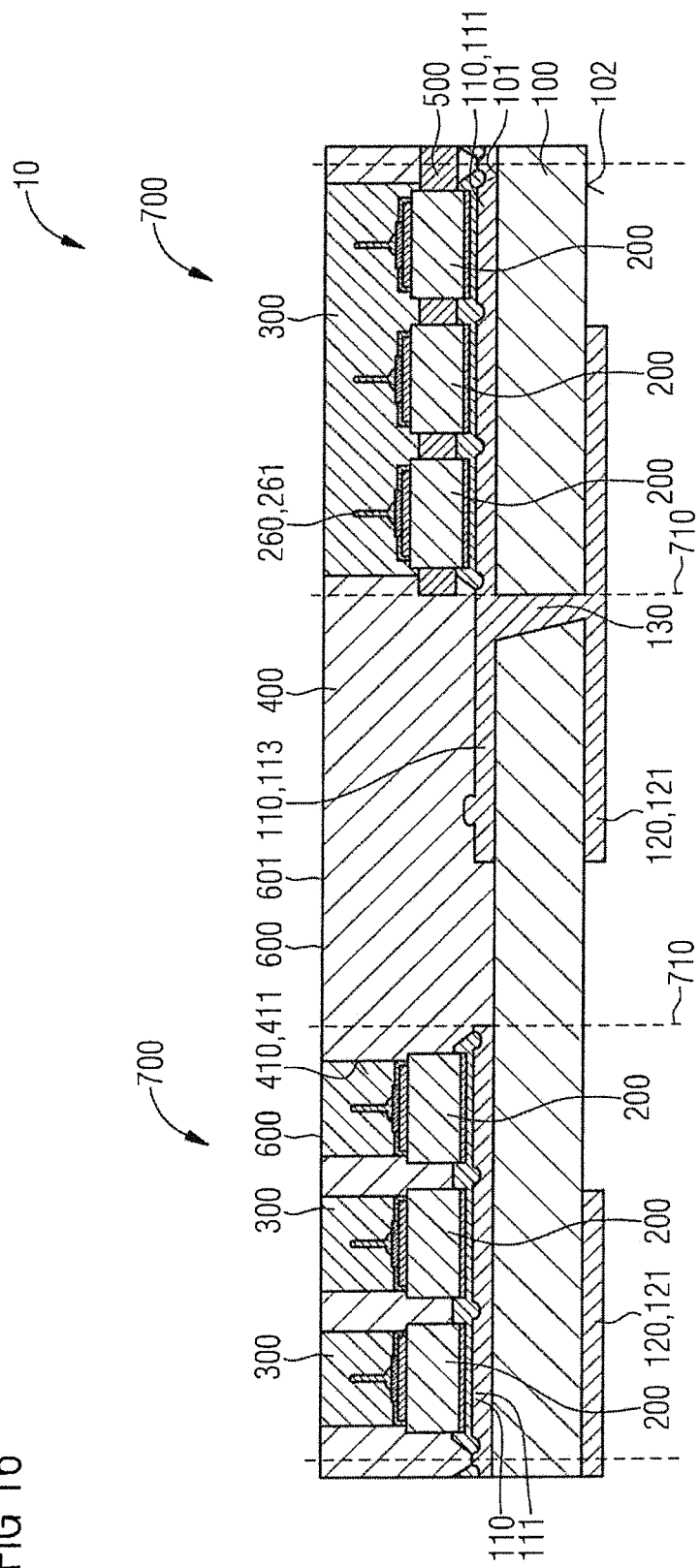
FIG. 16 schematically shows a first sectional side view of the carrier in the processing state shown in FIG. 15.
Figure 17:
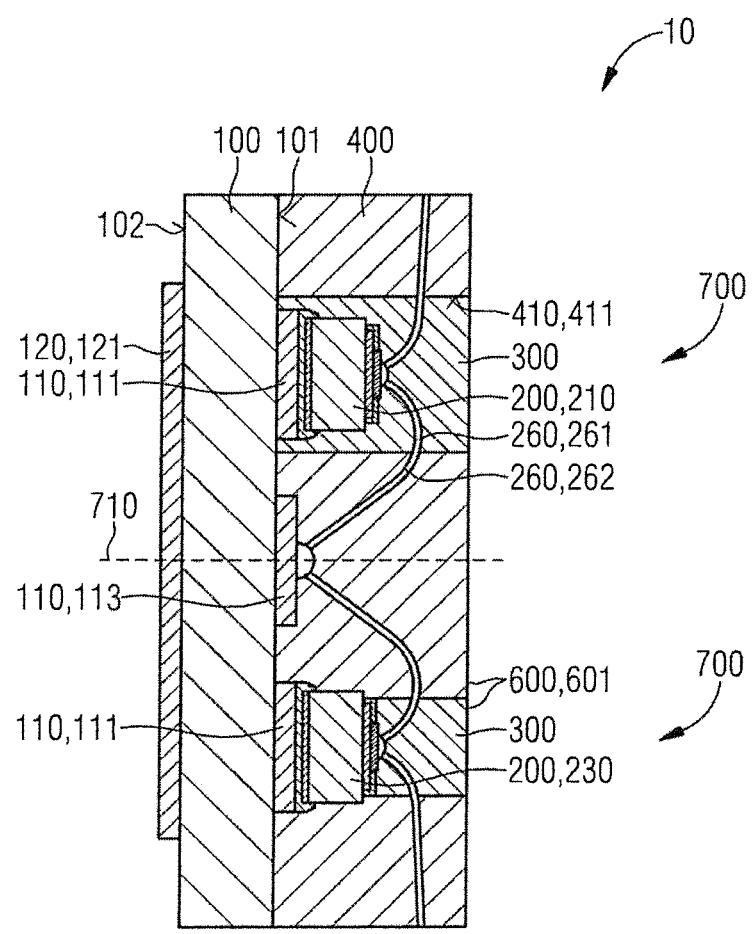
FIG. 17 schematically shows a second sectional side view of the carrier in the processing state shown in FIG. 15.

FIG. 15 shows, in a schematic illustration, a plan view of the top side 101 of the carrier 100 and the optoelectronic semiconductor chips 200 arranged at the top side 101 of the carrier 100 in a processing state temporally succeeding the illustration in FIGS. 12 to 14. FIGS. 16 and 17 show schematic sectional side views of the carrier 100 and the optoelectronic semiconductor chips 200 in the processing state shown in FIG. 15.

A housing material 400 has been arranged above the top side 101 of the carrier 100. In this case, the sections of the covering material 300 have been at least partly enclosed by the housing material 400. The covering material 300 has thus been at least partly embedded into the housing material 400. The covering material 300 and the housing material 400 jointly form a part of a housing 600. At a top side 601 of the housing 600 facing away from the top side 101 of the carrier 100, the sections of the covering material 300 are not covered by the housing material 400. The sections of the covering material 300 are exposed at the top side 601 of the housing 600. Preferably, the sections of the covering material 300 and the housing material 400 terminate flush at the top side 601 of the housing 600.

The housing material 400 may have been arranged above the top side 101 of the carrier 100, for example, by pressure-time metering, jetting, a molding method (mold method), for example, transfer molding, film-assisted or non-film-assisted injection molding, hot pressing or compression molding, or a printing method. The housing material 400 may comprise, for example, a plastic, for example, a thermosetting plastic, for instance an epoxy, a silicone or an acrylate, or a thermoplastic. The housing material 400 may comprise a filler. It is expedient for the housing material 400 to be highly filled and comprise a high hardness. In this case, the housing material 400 may effectively protect the optoelectronic component obtainable by the described production method against damage and against thermomechanical strains.

The housing material 400 may be configured such that it is optically reflective, for example, white, optically absorbing, for example, black, or of a different color. The housing material 400 may also be configured in a transparent fashion.

During the process of arranging the housing material 400 above the top side 101 of the carrier 100, second sections 262 of the bond wires 260 that had not already been embedded into the covering material 300 have been embedded into the housing material 400. The second sections 262 of the bond wires 260 may directly adjoin the first sections 261 of the bond wires 260. Embedding the bond wires 260 into either the covering material 300 or the housing material 400 may be complete. However, further sections of the bond wires 260 may also be arranged outside both the covering material 300 and the housing material 400. By way of example, further sections of the bond wires 260 may be embedded into the optically absorbing material 500. As a result of embedding the second sections 262 of the bond wires 260 into the housing material 400, the bond wires 260 are fixed and protected against damage as a result of external influences.

The sections of the covering material 300 embedded into the housing material 400 form cavities 410 in the housing material 400. The interfaces between the covering material 300 and the housing material 400 form walls 411 of the cavities 410. In the example shown in FIGS. 16 and 17, the walls 411 are oriented perpendicularly to the top sides 201 of the optoelectronic semiconductor chips 200. However, the walls 411 may also be inclined by an angle of −60° to +60° relative to a direction oriented perpendicularly to the top sides 201 of the optoelectronic semiconductor chips 200.

The top sides 201 of the optoelectronic semiconductor chips 200 are arranged in the cavities 410 formed by the covering material 300. Each top side 201 of each optoelectronic semiconductor chip 200 may be arranged in a respective dedicated cavity 410, as in, for example, the pixel 700 comprising the third optoelectronic semiconductor chip 230. However, the top sides 201 of all the optoelectronic semiconductor chips 200 of a common pixel 700 may also be arranged in a common cavity 410, as illustrated by way of example in the pixel 700 comprising the first optoelectronic semiconductor chip 210.

The production method may be concluded with the processing state shown in FIGS. 15 to 17. The product obtained by the method described forms an optoelectronic component 10. The optoelectronic component 10 may be a video wall module, for example.

Proceeding from the processing state shown in FIGS. 15 to 17, additional processing steps may optionally also be carried out. It is possible to remove the covering material 300 arranged in the cavities 410 formed in the housing material 400. The covering material 300 may be removed, for example, by dissolving away the covering material 300 using a solvent. The covering material 300 arranged at the top sides 201 of the optoelectronic semiconductor chips 200 in a previous processing step need not be configured in a light-transmissive fashion in this case.

It is possible for the cavities 410 in the housing material 400 to be left empty after the covering material 300 has been removed. It is likewise possible, after removal of the covering material 300 from the cavities 410 in the housing material 400, to introduce a further covering material into the cavities 410. In this case, the top sides 201 of the optoelectronic semiconductor chips 200 arranged in the cavities 410 are at least partly covered by the further covering material. Moreover, the first sections 261 of the bond wires 260 are at least partly embedded into the further covering material. It is expedient if the further covering material is arranged in the cavities 410 of the housing material 400 such that the housing material 400 and the further covering material terminate flush at the top side 601 of the housing 600, that is to say that the further covering material completely fills the cavities 410.

It is expedient for the further covering material to comprise a transmittance of at least 10% for electromagnetic radiation comprising a wavelength from at least one part of the ultraviolet to infrared spectral range. This enables electromagnetic radiation emitted by the optoelectronic semiconductor chips 200 to penetrate through the further covering material. The further covering material may additionally be optically effective, for example, comprise embedded scattering particles, embedded wavelength-converting particles or embedded absorbing particles.

Figure 18:
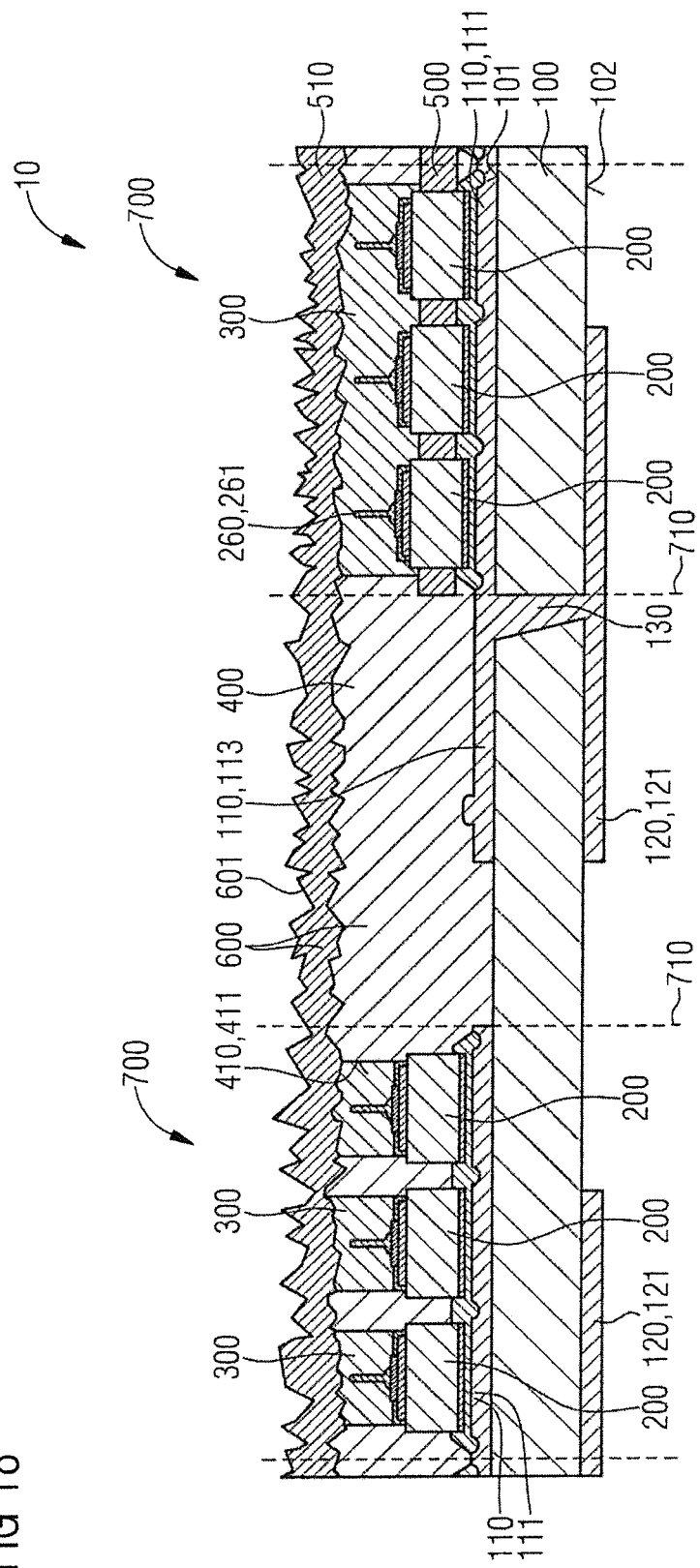
FIG. 18 schematically shows a sectional side view of the carrier after a process of arranging a further material above the covering material and the housing material.

FIG. 18 shows a schematic sectional side view of the optoelectronic component 10 after further optional processing steps succeeding the processing state shown in FIG. 16 have been carried out. The sectional view in FIG. 18 proceeds as in the illustration in FIG. 16.

Proceeding from the processing state shown in FIG. 16, first, the top side 601 of the housing has been patterned, for example, roughened. The parts of the housing material 400 exposed at the top side 601 of the housing 600 and also the parts of the covering material 300 (and/or of the further covering material) exposed at the top side 601 of the housing 600 have been patterned in this case.

A further material 510 has then been arranged above the covering material 300 (and/or the further covering material) and above the housing material 400. In this case, the further material 510 may have been arranged in one or a plurality of layers. A plurality of layers of different materials may also have been arranged. The further material 510 may serve, for example, as an antireflection layer or as a colored layer for coloration and/or contrast enhancement. The further material 510 may comprise a neutral density filter that absorbs, for example, a defined percentage, for example, 10% of electromagnetic radiation in a wide wavelength range. The further material 510 may also form an optical element, for example, an optical lens.

The further material 510 may then also have been patterned, for example, roughened. The patterning may bring about, for example, a scattering of ambient light impinging on the further material 510 from outside.

It is possible to carry out only one or some of the processing steps described with reference to FIG. 18. By way of example, it is possible to dispense with patterning the housing material 400 and the covering material 300 (and/or the further covering material), arranging the further material 510 or patterning the further material 510.

Figure 19:
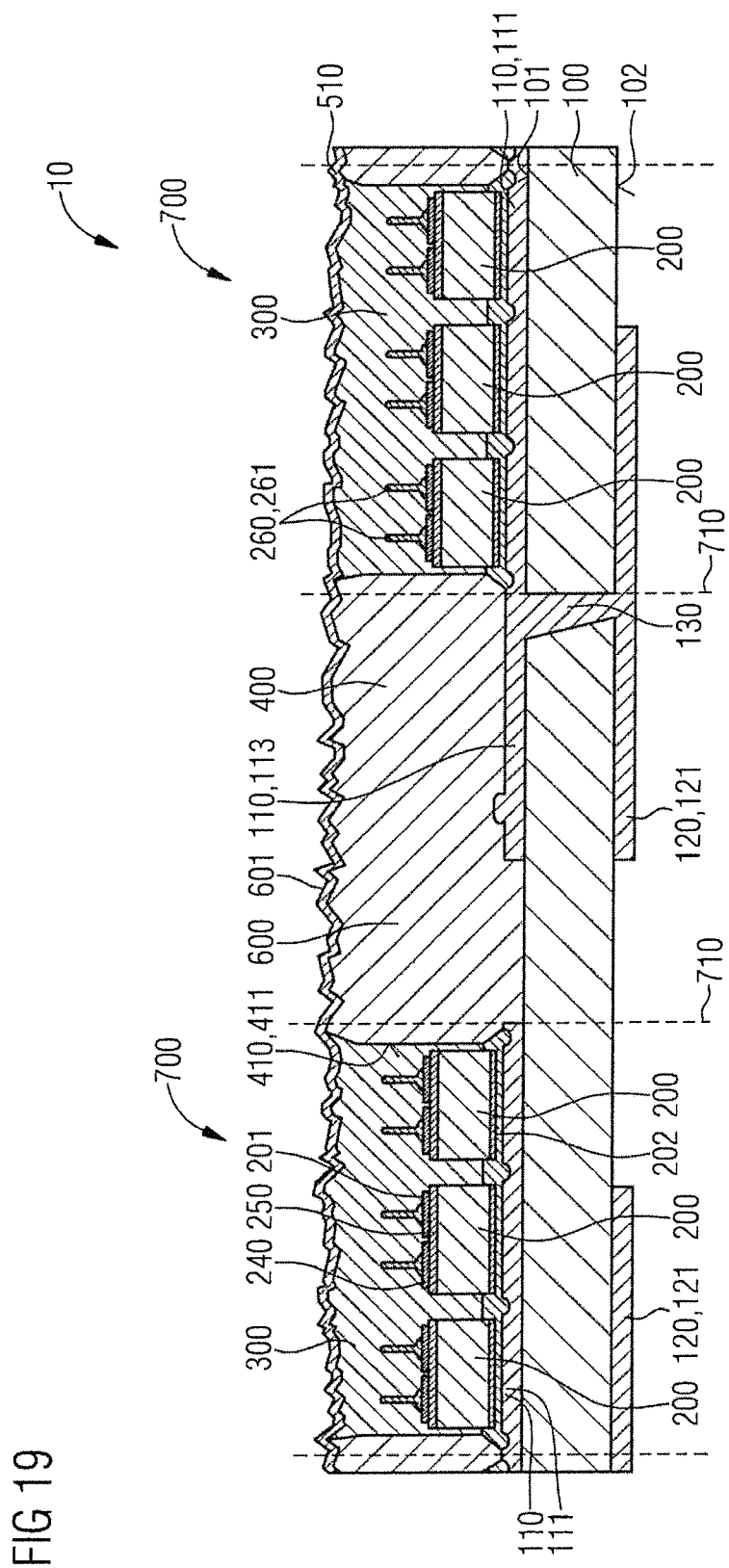
FIG. 19 schematically shows a sectional side view of the carrier, of the optoelectronic semiconductor chips arranged thereon, of the covering material arranged thereabove, and of the housing material arranged above the carrier in accordance with an alternative embodiment.
Figure 20:
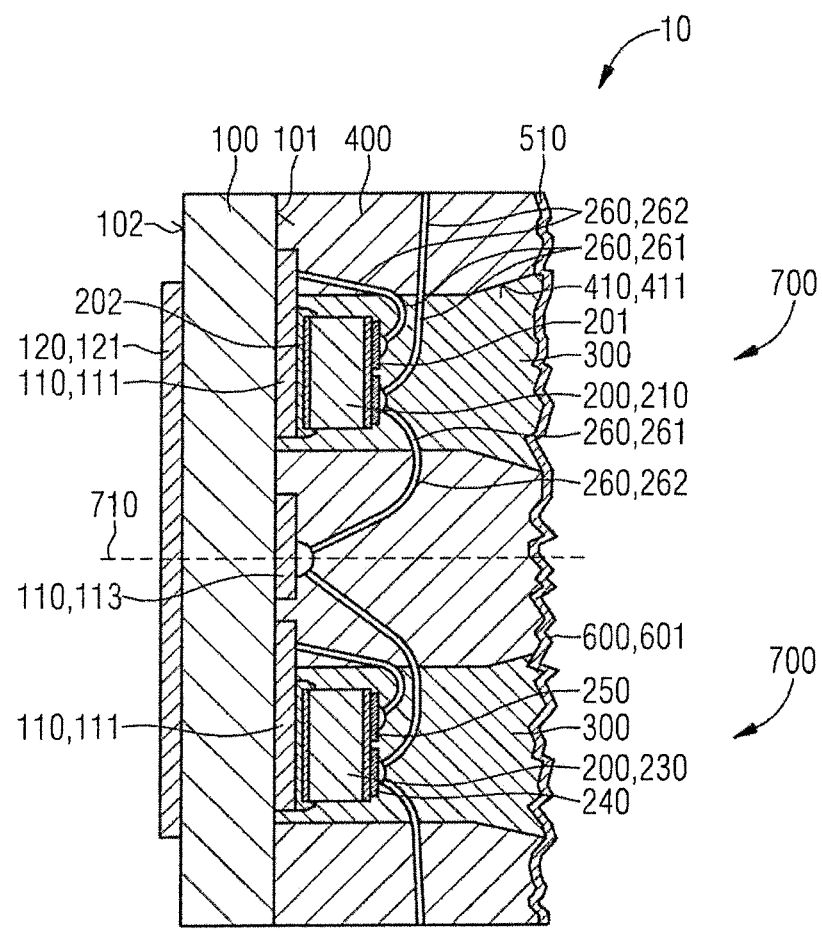
FIG. 20 schematically shows a further sectional side view of the embodiment shown in FIG. 19.

FIGS. 19 and 20 show schematic sectional side views of the optoelectronic component 10 in an alternative structure. The sectional view in FIG. 19 proceeds as in the illustration in FIG. 16. The sectional view in FIG. 20 proceeds as in the illustration in FIG. 17.

The example of the optoelectronic component 10 shown in FIGS. 19 and 20 corresponds, apart from the differences explained below, to the example of the optoelectronic component 10 as shown in FIGS. 15 to 17. Production of the example of the optoelectronic component 10 shown in FIGS. 19 and 20 is carried out, apart from the deviations described below, like the above-described production of the example of the optoelectronic component 10 shown in FIGS. 15 to 17.

The optoelectronic semiconductor chips 200 used to produce the optoelectronic component 10 of the example shown in FIGS. 19 and 20 differ from the optoelectronic semiconductor chips 200 described with reference to FIGS. 1 to 18 in that they are configured as volume emitting light emitting diode chips. During operation of the optoelectronic semiconductor chips 200, electromagnetic radiation is emitted not just at the top sides 201 of the optoelectronic semiconductor chips 200, but also at side faces of the optoelectronic semiconductor chips 200. Therefore, to produce the structure of the optoelectronic component 10 shown in FIGS. 19 and 20, a covering of the side faces of the optoelectronic semiconductor chips 200 by the optically absorbing material 500 is dispensed with.

In the example of the optoelectronic component 10 shown in FIGS. 19 and 20, the housing material 400 is expediently configured in an optically reflective fashion. By way of example, the housing material 400 may comprise a white color. As a result, the walls 411 of the cavities 410 configured in the housing material 400 bring about a gathering and focusing of the electromagnetic radiation emitted by the optoelectronic semiconductor chips 200.

In the example of the optoelectronic component 10 shown in FIGS. 19 and 20, a further material 510 may be arranged above the housing material 400 and the covering material 300, as in the example of the optoelectronic component 10 shown in FIG. 18. The further material 510 may, for example, be optically absorbing and/or comprise a rough surface. The further material 510 may be provided to increase an optical contrast between the light-emitting sections and the non-light-emitting sections of the top side 601 of the housing 600 of the optoelectronic component 10.

The optoelectronic semiconductor chips 200 used to produce the example of the optoelectronic component 10 shown in FIGS. 19 and 20 furthermore differ from the optoelectronic semiconductor chips 200 described with reference to FIGS. 1 to 18 in that the second electrical connection pads 250 are arranged jointly with the first electrical connection pads 240 at the top sides 201 of the optoelectronic semiconductor chips 200. In the of the optoelectronic component 10 shown in FIGS. 19 and 20, the electrically conductive connections between the second electrical connection pads 250 of the optoelectronic semiconductor chips 200 and the row lines 111 of the upper carrier metallization 110 are therefore produced by further bond wires 260. The further bond wires 260 may be arranged in the same processing step in which the electrically conductive connections between the first electrical connection pads 240 of the optoelectronic semiconductor chips 200 and the column connection structures 113 of the upper carrier metallization 110 are also produced. The further bond wires 260 may also comprise first sections 261 embedded into the covering material 300 and second sections 262 embedded into the housing material 400.

In a further example of the optoelectronic component 10, it is possible to use surface emitting optoelectronic semiconductor chips 200, in which both electrical connection pads 240, 250 are arranged at the top sides 201 of the optoelectronic semiconductor chips 200. It is likewise possible to use volume emitting optoelectronic semiconductor chips 200, in which the first electrical connection pads 240 are arranged at the top sides 201 and the second electrical connection pads 250 are arranged at the undersides 202 of the optoelectronic semiconductor chips 200.

Besides being used to produce a video wall module, the production method described may also produce other optoelectronic components 10 in which a first optoelectronic semiconductor chip 200 is arranged at a top side 101 of a carrier 100, a housing material 400 is arranged above the top side 101 of the carrier 100, a cavity 410 is configured in the housing material 400, a top side 201 of the first optoelectronic semiconductor chip 200 is arranged in the cavity 410, a first electrical connection pad 240 of the first optoelectronic semiconductor chip 200, the first electrical connection pad being arranged at the top side 201 of the first optoelectronic semiconductor chip 200, is electrically conductively connected by means of a bond wire 260 to a first contact pad 113 arranged at the top side 101 of the carrier 100, and a first section 261 of the bond wire 260 is arranged in the cavity 410 and a second section 262 of the bond wire 260 is embedded into the housing material 400.

Our components and methods have been illustrated and described in greater detail on the basis of preferred examples. Nevertheless, this disclosure is not restricted to the examples disclosed. Rather, other variations may be derived therefrom by those skilled in the art, without departing from the scope of protection of the appended claims.

This application claims priority of DE 10 2015 118 433.8, the subject matter of which is incorporated herein by reference.

The invention claimed is:

1. An optoelectronic component comprising a carrier,
a first optoelectronic semiconductor chip arranged at a top side of the carrier,
a second optoelectronic semiconductor chip arranged at the top side of the carrier, and
a housing material arranged above the top side of the carrier,
wherein a cavity is configured in the housing material,
a top side of the first optoelectronic semiconductor chip is arranged in the cavity and a top side of the second optoelectronic semiconductor chip is arranged in a further cavity of the housing material, the cavity and the further cavity being separated from one another,
the first optoelectronic semiconductor chip has a first electrical connection pad arranged at the top side of the first optoelectronic semiconductor chip, and electrically conductively connects by a bond wire to a first contact pad arranged at the top side of the carrier,
a first section of the bond wire is arranged in the cavity and a second section of the bond wire is embedded in the housing material, and
the first electrical connection pad of the first optoelectronic semiconductor chip and an electrical connection pad of the second optoelectronic semiconductor chip arranged at the top side of the second optoelectronic semiconductor chip are electrically conductively connected by the bond wire.

2. The optoelectronic component according to claim 1, wherein the cavity is defined by a wall inclined by an angle of −60° to +60° relative to a direction oriented perpendicularly to the top side of the first optoelectronic semiconductor chip.

3. The optoelectronic component according claim 1, further comprising:
a covering material arranged in the cavity and covering at least one part of the top side of the first optoelectronic semiconductor chip, wherein
the first section of the bond wire is embedded in the covering material.

4. The optoelectronic component according to claim 1,
wherein an optically absorbing material is arranged above the top side of the carrier, and
the first optoelectronic semiconductor chip is at least partly embedded in the absorbing material.

5. The optoelectronic component according to claim 1, wherein the first optoelectronic semiconductor chip has a second electrical connection pad arranged at an underside of the first optoelectronic semiconductor chip and electrically conductively connects to a second contact pad arranged at the top side of the carrier.

6. The optoelectronic component according to claim 1, wherein the first optoelectronic semiconductor chip has second electrical connection pad arranged at the top side of the first optoelectronic semiconductor chip and electrically conductively connects by a second bond wire to a second contact pad arranged at the top side of the carrier.

7. The optoelectronic component according claim 5,
wherein a third optoelectronic semiconductor chip is arranged at the top side of the carrier, and an electrical connection pad of the third optoelectronic semiconductor chip electrically conductively connects to the second contact pad.

8. The optoelectronic component according to claim 6,
wherein a third optoelectronic semiconductor chip is arranged at the top side of the carrier, and an electrical connection pad of the third optoelectronic semiconductor chip electrically conductively connects to the second contact pad.

9. A method of producing an optoelectronic component comprising:
jointly arranging first and second optoelectronic semiconductor chips at a top side of a carrier;
producing an electrically conductive connection between a first electrical connection pad of the first optoelectronic semiconductor chip, said first electrical connection pad being arranged at a top side of the first optoelectronic semiconductor chip, and a first contact pad arranged at the top side of the carrier, by a bond wire, wherein the first electrical connection pad of the first optoelectronic semiconductor chip and an electrical connection pad arranged at a top side of the second optoelectronic semiconductor chip are electrically conductively connected by the bond wire;
arranging a covering material at the top side of the first optoelectronic semiconductor chip, wherein a first section of the bond wire is embedded in the covering material; and
subsequently arranging a housing material above the top side of the carrier, wherein the covering material is at least partly enclosed by the housing material, a second section of the bond wire is embedded in the housing material,
a third optoelectronic semiconductor chip is arranged jointly with the first optoelectronic semiconductor chip at the top side of the carrier, and
sections of the covering material physically separated from one another are arranged above the top side of the first optoelectronic semiconductor chip and above a top side of the third optoelectronic semiconductor chip.

10. The method according to claim 9, wherein an interface forms between the covering material and the housing material, said interface being inclined by an angle of −60° to +60° relative to a direction oriented perpendicularly to the top side of the first optoelectronic semiconductor chip.

11. The method according to claim 9,
wherein, before arranging the covering material, an optically absorbing material is arranged above the top side of the carrier, and
the absorbing material is at least partly covered by the covering material.

12. The method according to claim 9 further comprising, after arranging the housing material, removing the covering material.

13. The method according to claim 12, further comprising arranging a further covering material in a cavity formed by removing the covering material.

14. The method according to claim 9,
wherein
the covering material is arranged such that a continuous section of the covering material extends over the top side of the first optoelectronic semiconductor chip and over a top side of the third optoelectronic semiconductor chip.

15. The method according to claim 9, further comprising arranging a further material above the covering material and/or the housing material.

16. The optoelectronic component according to claim 3, wherein the covering material and the housing material terminate flush at a top side facing away from the carrier.

17. The method according to claim 13, further comprising arranging a further material above the further covering material and/or the housing material.

* * * * *